(12) United States Patent
Yoon et al.

(10) Patent No.: US 11,411,206 B2
(45) Date of Patent: Aug. 9, 2022

(54) CIRCULARLY POLARIZING PLATE

(71) Applicant: LG CHEM, LTD., Seoul (KR)

(72) Inventors: Hyuk Yoon, Daejeon (KR); Nam Jeong Lee, Daejeon (KR); Jong Sung Park, Daejeon (KR); Moon Soo Park, Daejeon (KR); Jae Ho Jung, Daejeon (KR); Ji Sung Park, Daejeon (KR); Byoung Jun Mun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 399 days.

(21) Appl. No.: 16/628,640

(22) PCT Filed: Jul. 10, 2018

(86) PCT No.: PCT/KR2018/007800
§ 371 (c)(1),
(2) Date: Jan. 3, 2020

(87) PCT Pub. No.: WO2019/013520
PCT Pub. Date: Jan. 17, 2019

(65) Prior Publication Data
US 2020/0136094 A1  Apr. 30, 2020

(30) Foreign Application Priority Data
Jul. 10, 2017 (KR) .................. 10-2017-0087123

(51) Int. Cl.
*H01L 51/52* (2006.01)
*C08L 25/12* (2006.01)
(Continued)

(52) U.S. Cl.
CPC .......... *H01L 51/5293* (2013.01); *C08L 25/12* (2013.01); *C09K 19/3809* (2013.01); *G02B 5/3016* (2013.01); *H01L 27/3232* (2013.01)

(58) Field of Classification Search
CPC ............ H01L 51/5293; H01L 27/3232; H01L 51/5281; H01L 51/5203; C08L 25/12;
(Continued)

(56) References Cited

U.S. PATENT DOCUMENTS

2016/0077267 A1* 3/2016 Inagaki ................ G02B 5/3033
359/489.07
2016/0154157 A1 6/2016 Cho et al.
(Continued)

FOREIGN PATENT DOCUMENTS

CN    1409134 A     4/2003
CN    100447594 C   12/2008
(Continued)

OTHER PUBLICATIONS

Office Action of Japanese Patent Office in Appl'n No. 2020-500714, dated Feb. 16, 2021.

*Primary Examiner* — Donald L Raleigh
(74) *Attorney, Agent, or Firm* — Dentons US LLP

(57) ABSTRACT

The present application relates to a circularly polarizing plate and a use thereof. The present application can provide a circularly polarizing plate, which can be applied to a display device such as an organic light emitting display device to minimize blocking of light in the visible light region affecting image quality while blocking harmful ultraviolet rays appropriately and also has excellent durability. In addition, the present application can provide a circularly polarizing plate having excellent compensation characteristics at a viewing angle while ensuring process simplification and cost competitiveness.

20 Claims, 6 Drawing Sheets

(51) Int. Cl.
*C09K 19/38* (2006.01)
*G02B 5/30* (2006.01)
*H01L 27/32* (2006.01)

(58) Field of Classification Search
CPC ..... C08L 25/14; C08L 33/12; C09K 19/3809; C09K 19/38; G02B 5/3016; G02B 5/208; G02B 5/3083; G02B 5/305; C08F 224/00; C09D 125/12; C09D 133/12; C09D 137/00
See application file for complete search history.

(56) References Cited

U.S. PATENT DOCUMENTS

| | | | |
|---|---|---|---|
| 2017/0184766 | A1 | 6/2017 | Ozawa et al. |
| 2018/0327669 | A1 | 11/2018 | Hatsusaka et al. |

FOREIGN PATENT DOCUMENTS

| | | | |
|---|---|---|---|
| CN | 103250077 | A | 8/2013 |
| CN | 103477255 | A | 12/2013 |
| CN | 104737044 | A | 6/2015 |
| EP | 1930750 | A1 | 6/2008 |
| JP | 8-321381 | A | 12/1996 |
| JP | H08-321381 | A | 12/1996 |
| JP | 2007-530989 | A | 11/2007 |
| JP | 2009-103900 | A | 5/2009 |
| JP | 2009-122662 | A | 6/2009 |
| JP | 5057807 | B2 | 10/2012 |
| JP | 2015-501955 | A | 1/2015 |
| JP | 2016-535159 | A | 11/2016 |
| JP | 2017-102287 | A | 6/2017 |
| JP | 2017-120430 | A | 7/2017 |
| JP | 2017-529649 | A | 10/2017 |
| KR | 10-2010-0072038 | A | 6/2010 |
| KR | 10-1191124 | B1 | 10/2012 |
| KR | 10-1191125 | B1 | 10/2012 |
| KR | 10-1191129 | B1 | 10/2012 |
| KR | 10-1460862 | B1 | 11/2014 |
| KR | 10-1472187 | B1 | 12/2014 |
| KR | 2015-0091261 | A | 8/2015 |
| KR | 10-1557202 | B1 | 10/2015 |
| KR | 10-2016-0038324 | A | 4/2016 |
| KR | 10-2016-0051506 | A | 5/2016 |
| KR | 10-1640670 | B1 | 7/2016 |
| KR | 10-2016-0099517 | A | 8/2016 |
| KR | 10-1729819 | B1 | 4/2017 |
| KR | 10-1742845 | B1 | 6/2017 |
| WO | 2007/029788 | A1 | 3/2009 |
| WO | 2016/016156 | A1 | 2/2016 |
| WO | 2016/114254 | A1 | 7/2016 |
| WO | 2017/038265 | A1 | 3/2017 |
| WO | 2016/114255 | A1 | 7/2017 |
| WO | 2016/114253 | A1 | 8/2017 |
| WO | 2018/173778 | A1 | 9/2018 |

* cited by examiner

[Figure 1]
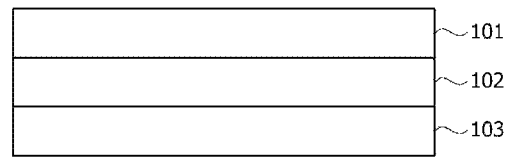
[Figure 2]
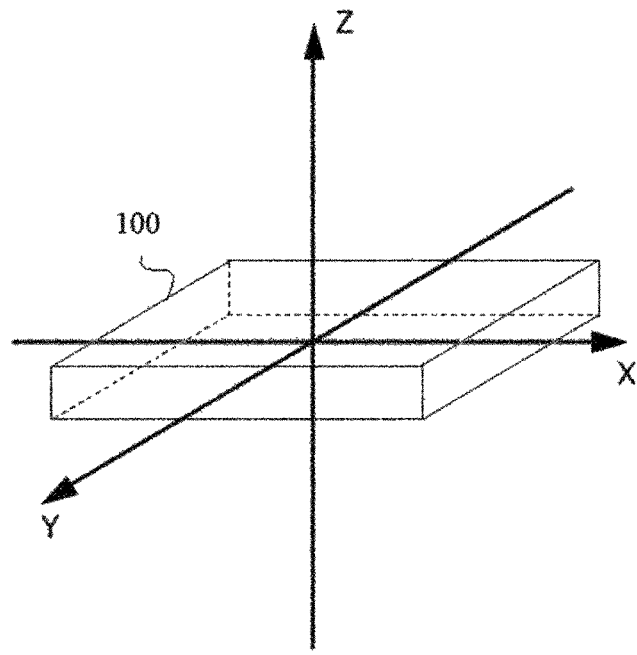
[Figure 3]
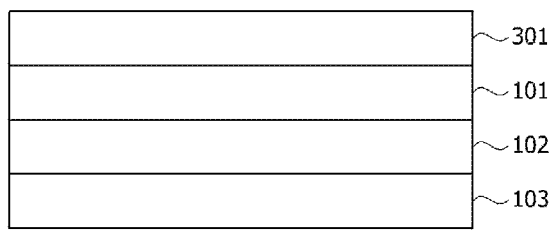

[Figure 4]
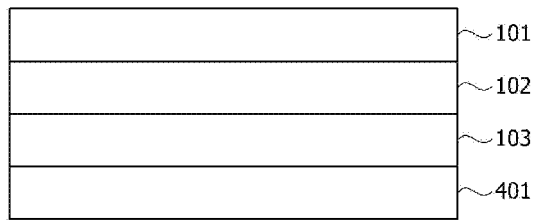
[Figure 5]
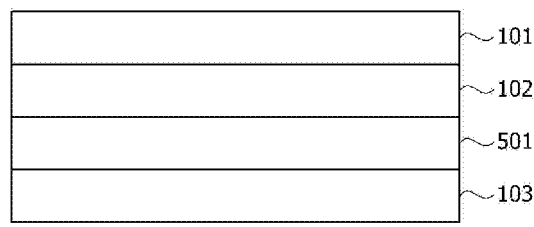
[Figure 6]
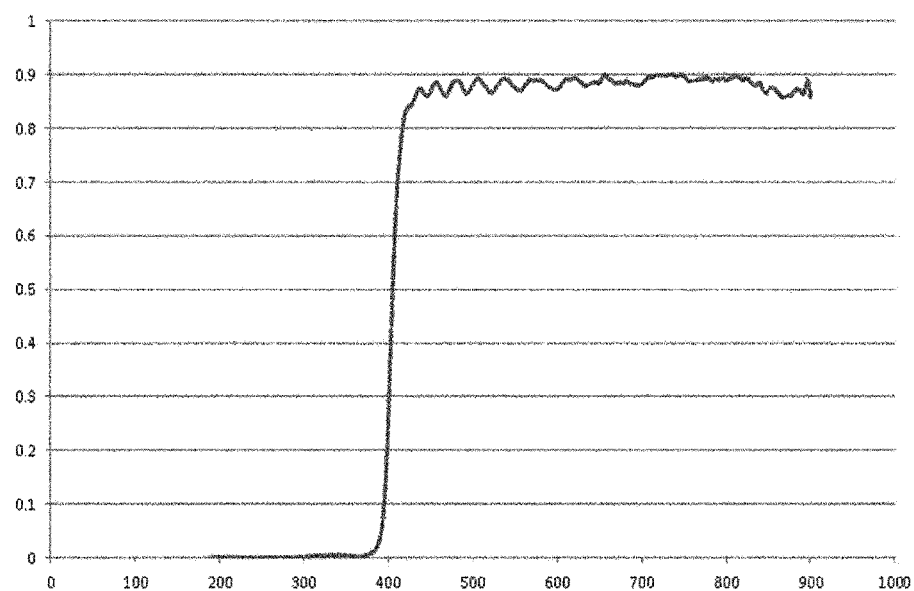

[Figure 7]
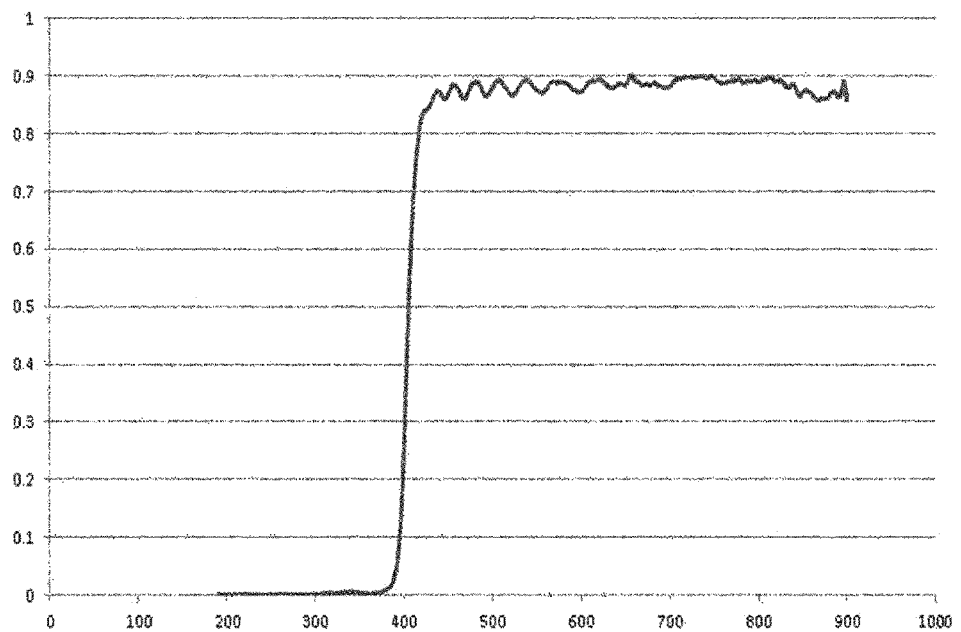
[Figure 8]
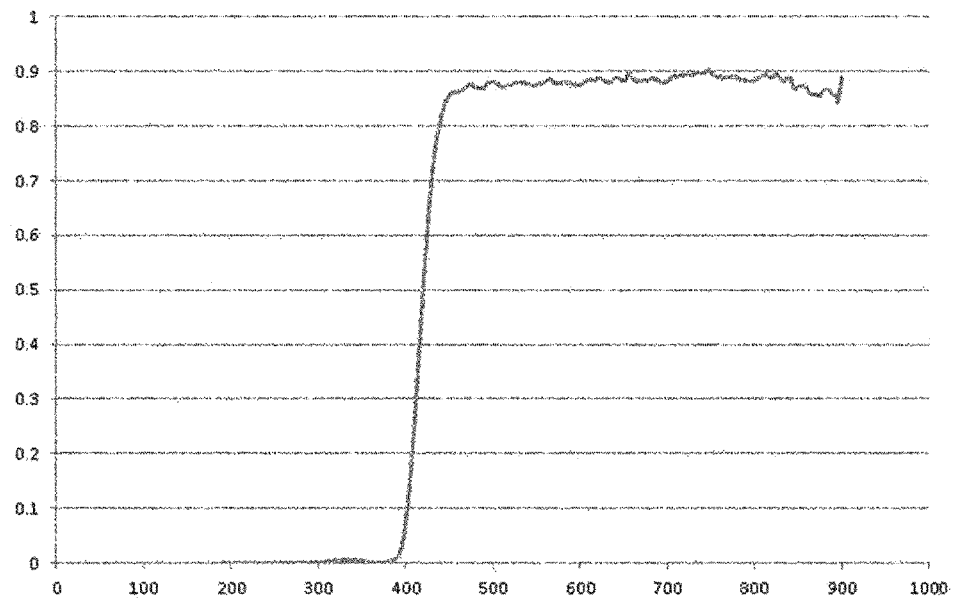

[Figure 9]
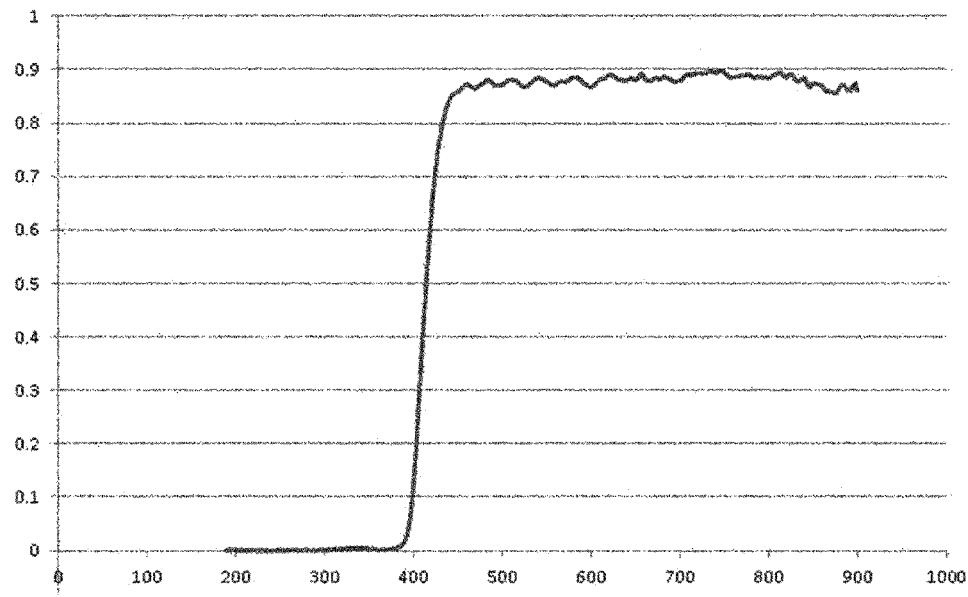
[Figure 10]
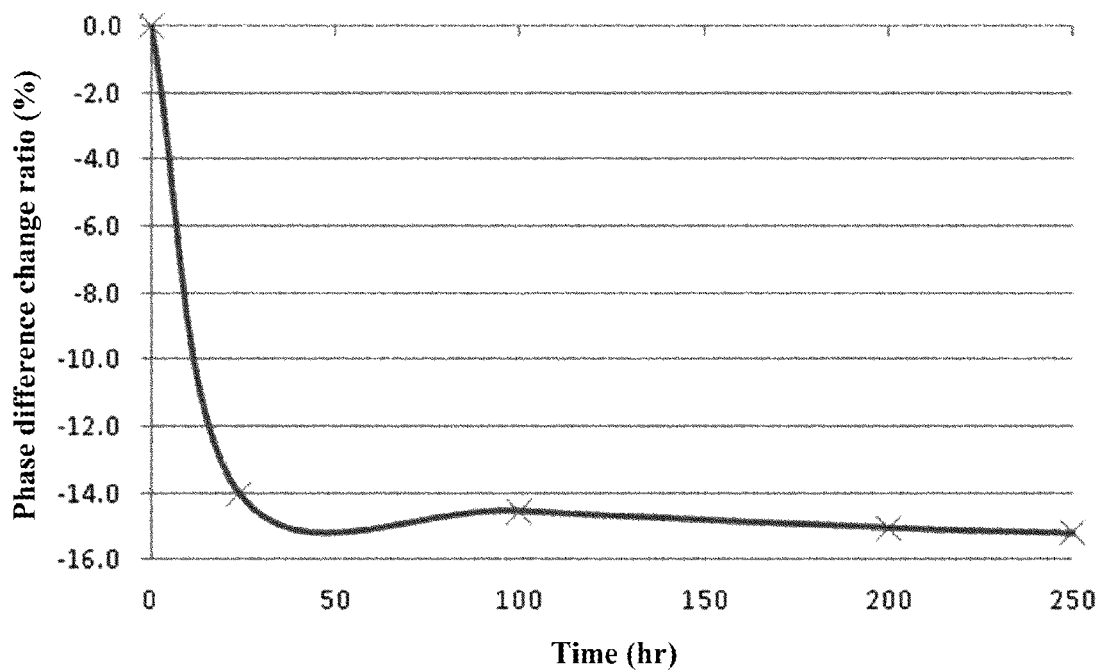

[Figure 11]
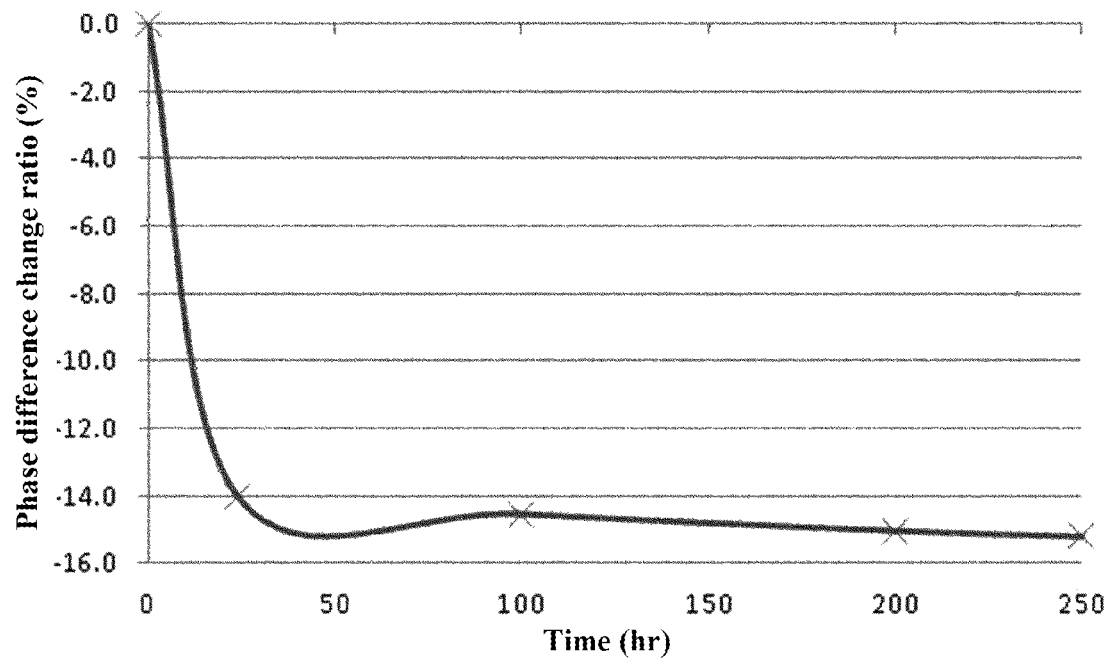
[Figure 12]
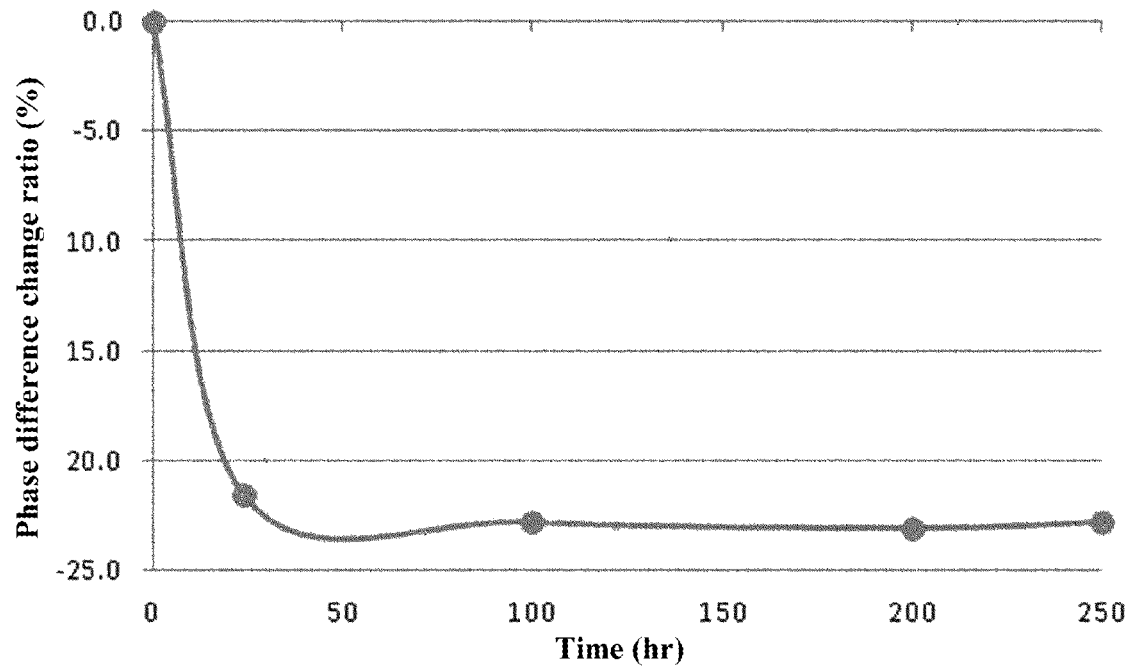

[Figure 13]
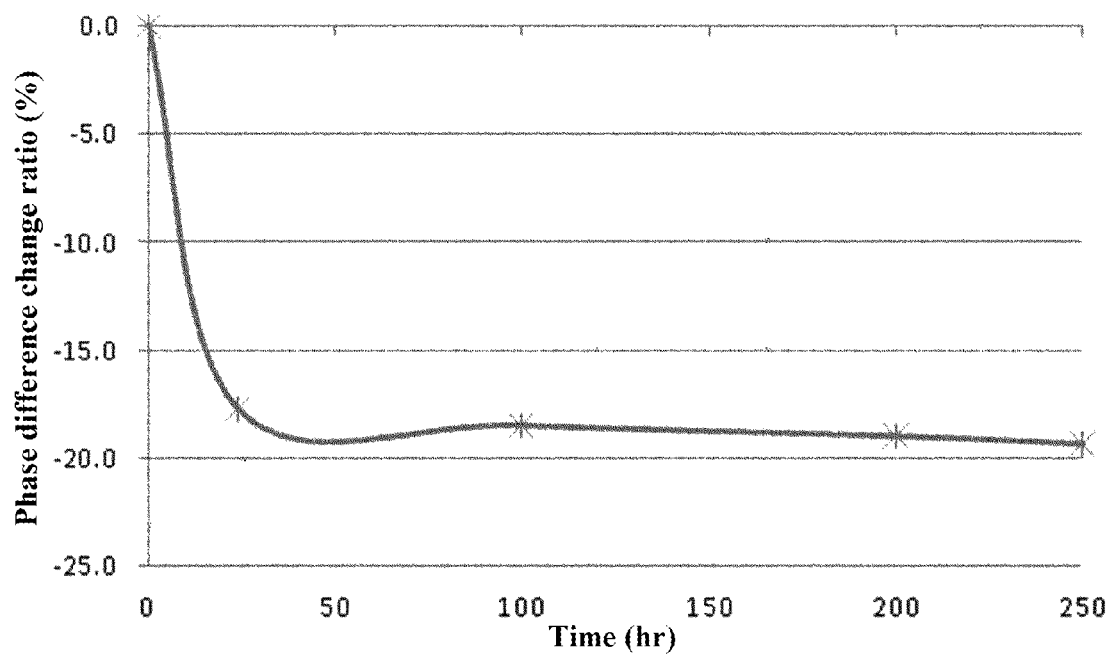

CIRCULARLY POLARIZING PLATE

The present application is a National Phase entry pursuant to 35 U.S.C. § 371 of International Application No. PCT/KR2018/007800 filed on Jul. 10, 2018, and claims priority to and the benefit of Korean Patent Application No. 10-2017-0087123 filed on Jul. 10, 2017, the disclosures of which are incorporated herein by reference in their entirety.

FIELD

The present application relates to a circularly polarizing plate.

BACKGROUND

A so-called circularly polarizing plate basically comprising a polarizer and a phase difference layer can be used for preventing external light reflection by a reflective electrode in an organic light emitting device. For example, Patent Document 1 (Japanese Unexamined Patent Publication No. H8-321381) discloses a method of arranging a circularly polarizing plate toward a transparent electrode in an organic light emitting device.

Techniques for imparting an ultraviolet light blocking function to an optical film such as a circularly polarizing plate have been known, where their representative method is a method of adding an ultraviolet absorber or a light stabilizer to a protective film laminated to protect a polarizer as shown in Patent Document 2 (Korean Patent No. 1742845).

However, the conventional method of adding an ultraviolet absorber or a light stabilizer to a protective film blocks ultraviolet rays having a wavelength in the range of less than about 380 nm, but does not efficiently block ultraviolet rays in the range of 380 nm to 400 nm, and there is no technique that recognizes the necessity of blocking ultraviolet rays in the above range.

However, when the circularly polarizing plate is applied to an organic light emitting device in particular, light having a wavelength in the range of 380 to 400 nm, which is not blocked by the conventional technique, adversely affects durability of the organic light emitting device. In addition, the light having a wavelength in the above range which is not blocked by the circularly polarizing plate can be reflected by the reflective electrode and may adversely affect the health of an observer.

In order to simply block the light having a wavelength in the range of 380 nm to 400 nm, a method of incorporating an ultraviolet absorber or light stabilizer having a maximum absorption wavelength in the relevant range into the constitution of the protective film or other circularly polarizing plates may be considered. However, if the wavelength range blocked by the ultraviolet absorber or the light stabilizer is not precisely adjusted, light in a short wavelength visible light region may be blocked by the circularly polarizing plate, which may affect display quality, such as causing color perception change. Furthermore, when the ultraviolet absorber or the light stabilizer is contained in the layer formed by a liquid crystal compound, the relevant components may adversely affect the entire durability of the circularly polarizing plate.

In addition, in order to improve compensation characteristics at viewing angles of the circularly polarizing plate, a phase difference film having a phase difference value in the thickness direction may be laminated on the circularly polarizing plate through a pressure-sensitive adhesive or an adhesive, but such a technique is not preferable in terms of process simplification and cost competitiveness.

SUMMARY

The present application relates to a circularly polarizing plate. It is one object of the present application to provide a circularly polarizing plate having excellent durability in itself, while selectively and effectively blocking light in an ultraviolet region that may affect the durability of a display device and the like, without affecting display performance of the display device such as color perceptions or image quality. In addition, it is one object of the present application to provide a circularly polarizing plate having excellent antireflection characteristics at a viewing angle while ensuring process simplification and cost competitiveness.

According to one aspect, the present invention provides a circularly polarizing plate comprising a base film, a phase difference layer on the base film, and a polarizer on the phase difference layer, wherein the base film comprises an acrylic resin and a styrene-based resin, the base film has a planar phase difference value of 5 nm or less in Equation 1 below and a thickness direction phase difference value of more than 0 nm in Equation 2 below, and the phase difference layer has ultraviolet absorptivity that transmittance for light having a wavelength of 385 nm is 3% or less:

$$Rin = d \times (nx - ny) \quad \text{[Equation 1]}$$

$$Rth = d \times (nz - ny) \quad \text{[Equation 2]}$$

wherein, Rin is the planar phase difference, Rth is the thickness direction phase difference, nx, ny and nz are the refractive indexes of the base film in the slow axis direction, in the fast axis direction and in the thickness direction, respectively, and d is the thickness of the base film.

According to further aspects, the present invention provides An organic light emitting display device comprising a reflective electrode, a transparent electrode, an organic layer interposed between the reflective electrode and the transparent electrode and having a light emitting layer, and the circularly polarizing plate of claim 1, wherein the circularly polarizing plate is present outside the reflective or transparent electrode and the phase difference layer is disposed closer to the reflective or transparent electrode than the polarizer.

BRIEF DESCRIPTION OF THE DRAWINGS

FIG. 1 exemplarily shows the circularly polarizing plate of the present application.

FIG. 2 exemplarily shows the x-axis, the y-axis and the z-axis.

FIG. 3 exemplarily shows the circularly polarizing plate of the present application.

FIG. 4 exemplarily shows the circularly polarizing plate of the present application.

FIG. 5 exemplarily shows the circularly polarizing plate of the present application.

FIGS. 6 and 7 are the measurement results of ultraviolet absorption characteristics for Examples 1 and 2, respectively.

FIGS. 8 and 9 show the measurement results of ultraviolet absorption characteristics for Comparative Examples 1 and 2, respectively.

FIGS. 10 and 11 are the durability measurement results for Examples 1 and 2, respectively.

FIGS. 12 and 13 are the durability measurement results for Comparative Examples 1 and 2, respectively.

DETAILED DESCRIPTION

An exemplary circularly polarizing plate comprises a base film, a phase difference layer on the base film, and a polarizer on the phase difference layer. The phase difference layer may be laminated on one side of the base film. The polarizer may be laminated on one side of the phase difference layer. FIG. 1 shows an exemplary circularly polarizing plate comprising a polarizer (101), a phase difference layer (102) and a base film (103) which are sequentially laminated.

In one example, the base film (103) may have a planar phase difference value of 5 nm or less. The planar phase difference value may be 0 nm or more, 3 nm or less, or 1 nm or less. In one example, the base film (103) may have a thickness direction phase difference value of more than 0 nm. In the present application, by applying the film having the phase difference characteristics as a base film, it is possible to improve compensation characteristics at a viewing angle while ensuring process simplification and price competitiveness. The thickness direction phase difference value of the base film (103) may be specifically 10 nm or more, 20 nm or more, 30 nm or more, 40 nm or more, or 50 nm or more, and may be 300 nm or less, 200 nm or less, 150 nm or less, or 120 nm or less. Within this range, the compensation characteristics at the viewing angle can be further improved. The planar phase difference value and the thickness direction phase difference value may be values for a wavelength of 550 nm, respectively.

In this specification, the term planar phase difference is a value determined according to Equation 1 below, and the thickness direction phase difference is a value determined according to Equation 2 below.

$$Rin = d \times (nx - ny) \quad \text{[Equation 1]}$$

$$Rth = d \times (nz - ny) \quad \text{[Equation 2]}$$

In Equations 1 and 2, Rin is the planar phase difference, Rth is the thickness direction phase difference, and nx, ny and nz are the refractive index in the x-axis direction (slow axis direction), the refractive index in the y-axis direction (fast axis direction), the refractive index in the z-axis direction (thickness direction), respectively, and this definition can be applied equally herein, unless otherwise specified. Here, for example, as shown in FIG. 2, the x-axis direction may mean the slow axis direction on the surface of the phase difference layer (100) in the form of a film or a sheet, the y-axis direction may mean a planar direction (fast axis direction) perpendicular to the x-axis, and the z-axis direction may mean the direction of the normal of the plane formed by the x-axis and the y-axis, for example, the thickness direction. In Equations 1 and 2, d is the thickness of the phase difference layer. Unless otherwise specified, the term refractive index herein is a refractive index for light at a wavelength of about 550 nm, and the Rin and Rth values are Rin and Rth values for light having a wavelength of 550 nm.

The base film may be a polymer film. The base film may comprise an acrylic resin and a styrene-based resin.

In this specification, the acrylic resin may mean a resin containing an acrylic monomer as a main component, for example, in an amount of more than 50 wt %, more than 70 wt % or more than 90 wt %. The acrylic monomer may mean acrylic acid, methacrylic acid, and derivatives thereof.

A specific example of the acrylic resin may be exemplified by a polymer obtained by polymerizing one or more monomers selected from a methacrylic acid ester such as cyclohexyl methacrylate, t-butylcyclohexyl methacrylate and methyl methacrylate; and an acrylic acid ester such as methyl acrylate, ethyl acrylate, butyl acrylate, isopropyl acrylate and 2-ethylhexyl acrylate, which may be a homopolymer thereof or a copolymer thereof with other monomers.

In one example, a copolymer of methyl methacrylate or methyl methacrylate and another monomer may be used as the acrylic resin. The monomer copolymerizable with methyl methacrylate may include other methacrylic acid alkyl esters, acrylic acid alkyl esters; aromatic vinyl compounds, such as styrene, and alkyl nuclear-substituted styrene such as o-methylstyrene, p-methylstyrene, 2,4-dimethylstyrene, ethylstyrene and p-tert-butylstyrene; and α-alkyl substituted styrene such as α-methylstyrene and α-methyl-p-methylstyrene; vinyl cyanides such as acrylonitrile and methacrylonitrile; maleimides such as N-phenylmaleimide and N-cyclohexylmaleimide; unsaturated carboxylic anhydrides such as maleic anhydride; and unsaturated acids such as acrylic acid, methacrylic acid and maleic acid, and the like. These may also be used alone or in combination of two or more.

Among these monomers copolymerizable with methyl methacrylate, acrylic acid alkyl esters may be preferred because they have excellent pyrolysis resistance and have high fluidity upon molding the methacrylic resin obtained by copolymerizing them. When the acrylic acid alkyl esters are copolymerized with methyl methacrylate, the copolymerization ratio of the acrylic acid alkyl esters is preferably 0.1 wt % or more from the viewpoint of pyrolysis resistance, and is preferably 15 wt % or less from the viewpoint of heat resistance. It is more preferably 0.2 wt % or more and 14 wt % or less, and particularly preferably 1 wt % or more and 12 wt % or less.

When methyl acrylate and ethyl acrylate, among the acrylic acid alkyl esters, are also copolymerized in a small amount such as 0.1 to 1 wt % with methyl methacrylate, they remarkably obtain the effect of improving the fluidity upon molding them as described above, and thus they are preferable.

In one example, a heat-resistant acrylic resin may be used as the acrylic resin. A specific example of the heat-resistant acrylic resin may include a copolymer of a methacrylic acid ester and/or an acrylic acid ester with aromatic vinyl compounds such as α-alkyl substituted styrenes such as α-methylstyrene and α-methyl-p-methylstyrene; vinyl cyanides such as acrylonitrile and methacrylonitrile; maleimides such as N-phenylmaleimide and N-cyclohexylmaleimide; unsaturated carboxylic anhydrides such as maleic anhydride; unsaturated carboxylic acids such as acrylic acid, methacrylic acid and maleic acid; and the like.

A preferred heat-resistant acrylic resin may include a methyl methacrylate-maleic anhydride-styrene copolymer. In particular, one having 40 to 90 wt % of methyl methacrylate units, 3 to 20 wt % of maleic anhydride units and 7 to 40 wt % of styrene units in the copolymer and one that the copolymerization ratio of styrene units with respect to the copolymerization ratio of maleic anhydride units (styrene unit/maleic anhydride unit) of 1 to 3 may be preferable in view of heat resistance and a photoelastic coefficient. Also, it is preferred to have 40 to 90 wt % of methyl methacrylate units, 5 to 19 wt % of maleic anhydride units and 10 to 40 wt % of styrene units in the copolymer, and it is particularly preferred to have 45 to 88 wt % of methyl methacrylate units, 6 to 15 wt % of maleic anhydride units and 16 to 40 wt % of styrene units in the copolymer. For production of such a heat-resistant acrylic resin, a method described in JP1988-001964 and the like can be used.

In one example, the acrylic resin may be a methyl methacrylate/methyl acrylate copolymer, a methyl methacrylate/ethyl acrylate copolymer, or a methyl methacrylate/maleic anhydride/styrene copolymer, where the methyl methacrylate/methyl acrylate copolymer may be particularly preferable in view of combining both fluidity upon molding and heat resistance in balance.

According to one example of the present application, as the acrylic resin, an acrylic resin having one or more ring structures selected from the group consisting of a structure formed by copolymerizing N-substituted maleimide in molecular chains, a lactone ring structure and a glutarimide structure can be used. Such an acrylic resin may be suitable for realizing a base film having the Rin and Rth values as well as heat resistance.

Two or more resins having different molecular weights and compositions, and the like may be used simultaneously in the acrylic resin of the present application The acrylic resin may have a weight average molecular weight of 50,000 to 200,000. The weight average molecular weight is preferably 50,000 or more from the viewpoint of the strength of the molded article, and preferably 200,000 or less from the viewpoint of moldability and fluidity. The still more preferred range is from 70,000 to 150,000.

As a method for producing an acrylic resin, for example, a commonly performed polymerization method such as cast polymerization, bulk polymerization, suspension polymerization, solution polymerization, emulsion polymerization and anionic polymerization can be used, but it is preferred to avoid incorporation of minute foreign materials for optical applications and from this viewpoint, bulk polymerization or solution polymerization without using a suspension agent or an emulsifier is preferable.

In the case of performing solution polymerization, a solution prepared by dissolving a mixture of monomers in an aromatic hydrocarbon solvent such as toluene or ethylbenzene can be used. When the polymerization is performed by bulk polymerization, the polymerization can be started by free radicals generated by heating, or ionizing radiation irradiation so as to be usually performed.

As the initiator used in the polymerization reaction, any initiator used in the radical polymerization can be used, and for example, azo compounds such as azobisisobutyronitrile or organic peroxides such as benzoyl peroxide, lauroyl peroxide, t-butyl peroxy-2-ethylhexanoate can be used.

Particularly, when the polymerization is performed at a high temperature of 90° C. or higher, the solution polymerization is generally used, and thus, a peroxide, an azobis initiator and the like, which are soluble in an organic solvent which is also used at a 10 hour half-life temperature of 80° C. or higher, are preferable. Specifically, it may include 1,1-bis(t-butylperoxy) 3,3,5-trimethylcyclohexane, cyclohexane peroxide, 2,5-dimethyl-2,5-di(benzoylperoxy) hexane, 1,1-azobis(1-cyclohexanecarbonitrile), 2-(carbamoylazo)isobutyronitrile, and the like. These initiators are preferably used in the range of 0.005 to 5 wt %.

A molecular weight regulator may be used as needed in the polymerization reaction, and any of those used for the radical polymerization can be used, for example, a mercaptan compound such as butyl mercaptan, octyl mercaptan, dodecyl mercaptan and 2-ethylhexyl thioglycolate is particularly preferable. These molecular weight regulators are added in such a concentration range that the polymerization degree of the acrylic resin is controlled within a preferable range.

The styrene-based resin of the present application may mean a resin containing, for example, more than 50 wt %, more than 70 wt % or more than 90 wt % of a styrene-based monomer. Here, the styrene-based monomer refers to a monomer having a styrene skeleton in its structure.

A specific example of the styrene-based monomer may include, in addition to styrene, vinyl aromatic compound monomers, such as alkyl nuclear-substituted styrene such as o-methylstyrene, m-methylstyrene, p-methylstyrene, 2,4-dimethylstyrene, ethylstyrene and p-tert-butylstyrene; and α-alkyl substituted styrene such as α-methylstyrene and α-methyl-p-methylstyrene, where a representative example is styrene.

The styrene-based resin may also include one obtained by copolymerizing a styrene-based monomer component with other monomer components. The copolymerizable monomer may include unsaturated carboxylic acid alkyl ester monomers, such as alkyl methacrylates such as methyl methacrylate, cyclohexyl methacrylate, methyl phenylmethacrylate and isopropyl methacrylate; and alkyl acrylates such as methyl acrylate, ethyl acrylate, butyl acrylate, 2-ethylhexyl acrylate and cyclohexyl acrylate; unsaturated carboxylic acid monomers such as methacrylic acid, acrylic acid, itaconic acid, maleic acid, fumaric acid and cinnamic acid; unsaturated dicarboxylic acid anhydride monomers which are anhydrides of maleic anhydride, itaconic acid, ethyl maleic acid, methyl itaconic acid, chlormaleic acid, and the like; unsaturated nitrile monomers such as acrylonitrile and methacrylonitrile; conjugated dienes such as 1,3-butadiene, 2-methyl-1,3-butadiene (isoprene), 2,3-dimethyl-1,3-butadiene, 1,3-pentadiene and 1,3-hexadiene, and the like, and two or more of these may also be copolymerized.

In one example, a styrene-acrylonitrile copolymer, a styrene-methacrylic acid copolymer or a styrene-maleic anhydride copolymer may be used as the styrene-based resin in view of excellent heat resistance.

Since the styrene-acrylonitrile copolymer, styrene-methacrylic acid copolymer or styrene-maleic anhydride copolymer has high compatibility with the acrylic resin, the copolymer may also be preferable in that a film which has high transparency, causes phase separation during use and does not deteriorate transparency can be obtained. From this viewpoint, it may be preferable to use, as an acrylic resin, a polymer containing methyl methacrylate as a monomer component.

In the case of the styrene-acrylonitrile copolymer, the copolymer ratio of acrylonitrile in the copolymer may be 1 to 40 wt %, 1 to 30 wt % or 1 to 25 wt %. When the copolymer ratio of acrylonitrile in the copolymer is in the above range, it may be preferable in terms of ensuring excellent transparency.

In the case of the styrene-methacrylic acid copolymer, the copolymer ratio of methacrylic acid in the copolymer may be 0.1 to 50 wt %, 0.1 to 40 wt % or 0.1 to 30 wt %. It may be preferable in terms of having excellent heat resistance if the copolymer ratio of methacrylic acid in the copolymer is 0.1 wt % or more, and having excellent transparency if it is 50 wt % or less.

In the case of the styrene-maleic anhydride copolymer, the copolymer ratio of maleic anhydride in the copolymer may be 0.1 to 50 wt %, 0.1 to 40 wt % or 0.1 to 30 wt %. It may be preferable in terms of having excellent heat resistance if the copolymer ratio of maleic anhydride in the copolymer is 0.1 wt % or more, and having excellent transparency if it is 50 wt % or less.

Among these, the styrene methacrylic acid copolymer and the styrene maleic anhydride copolymer are particularly preferable from the viewpoint of heat resistance. As the styrene-based resin, a number of resins having different compositions, molecular weights, and the like can be used in combination.

The styrene-based resin can be obtained by known anion, bulk, suspension, emulsion or solution polymerization methods. In the styrene-based resin, the unsaturated double bonds of the conjugated diene or the benzene ring of the styrene-based monomer are optionally hydrogenated. The hydrogenation rate can be measured by a nuclear magnetic resonance apparatus (NMR).

The base film may be produced using a resin composition comprising an acrylic resin and a styrene-based resin. From the viewpoint of controlling the photoelastic coefficient, heat resistance and phase difference value, it may be preferable to include 0.1 to 99.9 parts by weight of the acrylic resin relative to 100 parts by weight of the total amount of the acrylic resin and the styrene-based resin, and specifically, it may be preferable to be include the acrylic resin in an amount of 10 to 90 parts by weight, 15 to 85 parts by weight, 20 to 80 parts by weight, 30 to 70 parts by weight or 40 to 60 parts by weight.

In addition to the acrylic resin and the styrene-based resin, other resin components may be added to the resin composition to be the material of the base film, in a range that the effect is not impaired. At this time, other resin components may include polyolefins such as polyethylene and polypropylene; thermoplastic resins such as polyamide, polyphenylene sulfide, polyether ether ketone, polyester, aliphatic polyester resin, polysulfone, polyphenylene oxide, polyimide, polyether imide and polyacetal; and thermosetting resins such as phenol resin, melamine resin, silicone resin and epoxy resin, and the like. One or more of these resin components may be used. The ratio of other resin components is preferably 20 parts by weight or less relative to 100 parts by weight of the total amount of the acrylic resin and the styrene-based resin.

Also, optional additives may be combined to the resin composition, which is a raw material of the base film, according to various purposes in the range that the effects of the present application are not impaired. The kind of the additive is not particularly limited as long as it is generally used for combination of a resin or a rubber type polymer. It may include an inorganic filler such as silicon dioxide; a pigment such as iron oxide; a lubricant such as stearic acid, behenic acid, zinc stearate, calcium stearate, magnesium stearate and ethylene bis(stearamide); a releasing agent; a softener plasticizer such as a paraffinic process oil, a naphthenic process oil, an aromatic process oil, paraffin, organo polysiloxane and a mineral oil; an antioxidant such as a hindered phenolic antioxidant and a phosphorus stabilizer; a hindered amine light stabilizer; a flame retardant; an antistatic agent; a stiffener such as organic fiber, glass fiber, carbon fiber and metal whisker; a colorant; an ultraviolet absorber, other additives or a mixture thereof, and the like. These additives are preferably added in an amount of 0.01 to 50 parts by weight relative to 100 parts by weight of the total amount of the acrylic resin and the styrene-based resin.

The method for producing the resin composition to be the base film material is not particularly limited, but known methods can be used. For example, it may be prepared by adding a resin component and, if necessary, a hydrolysis-resistant inhibitor or the other components, and melting and kneading them by means of a melt kneader such as a single-screw extruder, a twin-screw extruder, a banbury mixer, a Brabender and various kneaders.

The resin composition to be the base film material preferably has an absolute value of the photoelastic coefficient of 0 $Pa^{-1}$ or more and $5.0 \times 10^{-12}$ $Pa^{-1}$ or less. The photoelastic coefficient is a coefficient indicating the easiness of occurrence of a change in birefringence due to an external force, which is described in various documents (for example, Chemical Review, No. 39, 1998 (published by Japan Scientific Societies Press Center)). In the present application, photoelastic coefficient is defined by the following equation: $C = \Delta n / \sigma$ $\Delta n = n1 - n2$ (wherein, C: photoelastic coefficient, $\sigma$: elongation stress [Pa], $\Delta n$: birefringence in the planar direction at the time of stress application, n1: refractive index for light having a polarization plane in a direction parallel to the elongation direction, n2: refractive index for light having a polarization plane in a direction perpendicular to the elongation direction)

The closer the absolute value of the photoelastic coefficient is to zero, the smaller the change in birefringence due to the external force, and it means that the designed change in birefringence for each application is small, whereby optical characteristics are excellent.

The absolute value of the photoelastic coefficient is more preferably 0 $Pa^{-1}$ or more and $4.5 \times 10^{-12}$ $Pa^{-1}$ or less, and particularly preferably 0 $Pa^{-1}$ or more and $4.0 \times 10^{-12}$ $Pa^{-1}$ or less. In another example, the photoelastic coefficient may be 0 $m_2/N$ or more and $2 \times 10^{-12}$ $m_2/N$ or less.

In the resin composition to be the base film material, the control of such a photoelastic coefficient can be performed by the combination ratio of the resin components. That is, it can be controlled by the combination ratio of the acrylic resin and the styrene-based resin in the resin composition.

The base film forming method is not particularly limited, but it is possible to be molded into a film by a known method such as injection molding, sheet molding, blow molding, injection blow molding, inflation molding, extrusion molding, foam molding and cast molding, and a secondary processing molding method such as pressure molding and vacuum molding can also be used. Among them, extrusion molding and cast molding are preferably used. At this time, an unstretched film can be extruded and molded by using, for example, an extruder equipped with a T-die, a circular die or the like. When a molded product is obtained by extrusion molding, a previously melt-kneaded material of various resin components, additives, and the like may also be used, and the molded product may also be molded via melt-kneading at the time of extrusion molding. The unstretched film may also be cast-molded by dissolving various resin components with a solvent common to various resin components, for example, a solvent such as chloroform and methylene dichloride, and then casting, drying and solidifying them.

The base film can be produced by biaxially stretching an extruded film. The biaxial stretching may be performed in a mechanical direction (MD, longitudinal direction or length direction) and a direction going straight to the mechanical direction (TD; transverse direction, cross direction or width direction), respectively. The biaxial stretching may be performed by a simultaneous biaxial stretching method or a sequential biaxial stretching method. The stretching may be performed by a tenter stretching method or a tubular stretching method.

The retardation control of the base film is generally performed by controlling the stretching conditions of the film. This is because the retardation is caused by the thickness of the film itself due to stretching of the film. In the case of biaxial stretching, the ratio (MD direction/TD direction) of draw ratios in the mechanical direction (MD direction) and the direction (TD direction) going straight to the mechanical direction is preferably 0.67 or less or 1.5 or more, more preferably 0.55 or less or 1.8 or more, and most preferably 0.5 or less or 2 or more.

Such a draw ratio is a standard at the time of obtaining the desired retardation, where various stretching conditions can be applied to obtain the desired retardation. However, from the viewpoint of heat resistance and strength, the draw ratio is preferably 0.1% or more and 1000% or less, more preferably 0.2% or more and 600% or less, and particularly preferably 0.3% or more and 300% or less in at least any one direction of a mechanical direction and a direction going straight to the mechanical direction. By designing it in this range, the base film having preferable heat resistance and strength can be obtained.

The base film may exhibit excellent durability at a high temperature. In one example, the base film may have a phase difference change ratio of 3% or less at a high temperature of 85° C. or 95° C.

In the present application, the thickness of the base film is preferably 0.1 μm or more from the viewpoint of handling properties, and is preferably 300 μm or less from the viewpoint of slimming which is required in the related technical field. The thickness may be 1 μm or more, 10 μm or more, 20 μm or more, 30 μm or more, or 40 μm or more, and may be 200 μm or less, or 100 μm or less in terms of realizing sufficient phase difference.

In the circularly polarizing plate of the present application, the polarizer (e.g., 101) and/or phase difference layer (e.g., 102) are designed to have optical characteristics controlled for light in the ultraviolet region, particularly at any one wavelength in a range of 380 nm to 400 nm or wavelengths in a certain range. In particular, the present application can provide a circularly polarizing plate matching the object of the present application by designing the phase difference layer so as to be capable of selectively blocking ultraviolet rays of a specific wavelength or range of wavelengths without applying an additive such as an ultraviolet absorber or a light stabilizer.

The circularly polarizing plate of the present application is capable of providing stable durability in itself, while effectively blocking ultraviolet rays affecting the durability of the device by such a design, and can also be applied to a display device to maintain the display quality of the device.

In this specification, the term polarizer means a film, sheet or element having a polarization function. The polarizer is a functional element capable of extracting light that vibrates in one direction from incident light that vibrates in various directions.

In the present application, a polarizer in the form of an absorptive linear polarizer can be used. As such a polarizer, a PVA (poly(vinyl alcohol)) polarizer is known. Basically, in the present application, a known polarizer can be used as the polarizer. In one example, as the known PVA (poly(vinyl alcohol)) polarizer, a polarizer having the following characteristics can be applied.

As the polarizer applied in the present application, a polarizer having single transmittance (Ts) for light having a wavelength of 390 nm of 20% or more and 60% or less, can be used. In another example, the single transmittance of the polarizer for light having a wavelength of 390 nm may be 59% or less, 58% or less, 57% or less, 56% or less, 55% or less, 54% or less, 53% or less, 52% or less, 51% or less, 50% or less, 49% or less, 48% or less, 47% or less, 46% or less, 45% or less, 44% or less, 43% or less, 42% or less, 41% or less, or 40% or less, and may be 21% or more, 22% or more, 23% or more, 24% or more, or 25% or more.

The single transmittance of the polarizer can be measured using, for example, a spectrometer (V7100, manufactured by Jasco). For example, after the air is set to the base line in a state where the polarizer sample (not including the upper and lower protective films) is placed on the apparatus and each transmittance is measured in a state in which the axis of the polarizer sample is vertically and horizontally aligned with the axis of the reference polarizer, the single transmittance can be calculated.

The circularly polarizing plate can be imparted with an appropriate ultraviolet blocking property and stably maintains durability by combining the polarizer whose single transmittance for light having a wavelength of 390 nm is controlled in the above range with a phase difference layer to be described below.

In general, the PVA (poly(vinyl alcohol))-based linear absorptive polarizer exhibits the above single transmittance, and in the present application, such a PVA-based linear absorptive polarizer can be applied, but the kind of the polarizer that can be applied is not limited to the above, as long as it exhibits the above single transmittance.

The PVA polarizer generally comprises a PVA film or sheet and an anisotropic absorbent material, such as a dichroic dye or iodine, adsorbed and oriented on the PVA film or sheet.

The PVA film or sheet can be obtained, for example, by gelling polyvinyl acetate. The polyvinyl acetate can be exemplified by a homopolymer of vinyl acetate; and a copolymer of vinyl acetate and other monomers, and the like. Here, the other monomers copolymerized with vinyl acetate can be exemplified by one or two or more of an unsaturated carboxylic acid compound, an olefinic compound, a vinyl ether compound, an unsaturated sulfonic acid compound and an acrylamide compound having an ammonium group, and the like.

The polyvinyl acetate has generally a gelation degree of about 85 mol % to about 100 mol % or 98 mol % to 100 mol % or so. The polyvinyl alcohol in the linear polarizer may have generally a polymerization degree of about 1,000 to about 10,000 or about 1,500 to about 5,000.

The PVA polarizer is produced via a dyeing process and a stretching process on the PVA film or sheet. If necessary, the production process of the polarizer may further comprise a swelling, crosslinking, cleaning and/or drying process(es).

Here, for example, the dyeing process is a process for adsorbing iodine, which is an anisotropic absorbent material, on a PVA film or sheet, and may be performed by immersing the PVA film or sheet in a treatment tank containing iodine and potassium iodide, where in this procedure, the single transmittance can be controlled by a method of controlling the concentration of iodine and potassium iodide in the treatment tank.

In the dyeing process, the PVA film or sheet is immersed in a dyeing solution or a crosslinking solution containing an iodide such as iodine ($I_2$) or KI and/or a boric acid compound (boric acid or a borate) or the like, where in this procedure, the anisotropic absorbent material such as iodine is adsorbed on the PVA film or sheet. Accordingly, in the procedure, the kind or amount of the anisotropic absorbent material adsorbed on the polarizer is determined depending on the concentration of the compound in the dyeing solution, whereby the absorption rate and transmittance of the polarizer for light having a specific wavelength can be determined.

For example, a species of the iodine compound that may be present in the dyeing solution may be $I^-$, $I_2$, $I_3^-$ or $I_5^-$, and the like derived from an iodide ($M+I^-$) and iodine ($I_2$). Among these compounds, $I^-$ has an absorption wavelength range of about 190 nm to 260 nm and its effect on the color perception is not significant, $I_2$ has an absorption wavelength range of about 400 nm to 500 nm and its color perception is mainly red, $I_3^-$ has an absorption wavelength range of about 250 nm to 400 nm and its color perception is mainly yellow, Is of the linear structure has no observed absorption wavelength range and its effect on the color perception is not significant, and $I_5^-$ of the curved structure has an absorption wavelength range of about 500 nm to 900 nm and its color perception is mainly blue.

Therefore, by controlling the species ratio of the iodine compound formed in the dyeing solution, it is possible to control the single transmittance for light having a wavelength of 390 nm.

The dyeing solution is generally an iodine solution which is an aqueous solution in which iodine ions are formed through iodine, and an iodide as a solubilizing aid, and a boric acid compound is also added to the aqueous solution for the crosslinking process, where the species and ratio of the iodine compound formed in the relevant dyeing solution can be determined depending on the concentration of the iodine and iodide added to the aqueous solution. As the iodinated compound, for example, potassium iodide, lithium iodide, sodium iodide, zinc iodide, aluminum iodide, lead iodide, copper iodide, barium iodide, calcium iodide, tin iodide or titanium iodide, and the like can be used.

In order to produce a polarizer that satisfies the transmittance characteristics for light having a wavelength of 390 nm, which is a condition of the present application, it can be controlled so that the concentration of the iodide in the dyeing solution used in the dyeing process is about 1.5 wt % or more and the concentration of the iodine ($I_2$) is 0.05 to 20 wt % or so. In another example, the concentration of the iodide may be about 20 wt % or less, 18 wt % or less, 16 wt % or less, 14 wt % or less, 12 wt % or less, 10 wt % or less, 8 wt % or less, or about 7 wt % or less. Also, in another example, the concentration of the iodine may be 19 wt % or less, 18 wt % or less, 17 wt % or less, 16 wt % or less, 15 wt % or less, 14 wt % or less, 13 wt % or less, 12 wt % or less, 11 wt % or less, 10 wt % or less, 9 wt % or less, 8 wt % or less, 7 wt % or less, 6 wt % or less, 5 wt % or less, 4 wt % or less, 3 wt % or less, 2 wt % or less, or 1 wt % or less or so.

If the concentration of the iodide and/or iodine in the dyeing solution is provided in the above range, the species and concentration of the iodine compound in the dyeing solution can be formed so that the single transmittance for light having a wavelength of 390 nm can fall within the above-mentioned range.

For the production of the polarizer applied in the present application, the concentration of the dyeing liquid applied in the dyeing process can be adjusted as described above, and other processes can be performed according to generally known methods. In addition, the dyeing process can also be performed according to a known method, except that the concentration of the dyeing solution is controlled as described above.

For example, in the dyeing process, a PVA film or sheet can be immersed into the dyeing solution controlled as above. In the dyeing process, the temperature of the dyeing solution is usually about 20 to 50° C. or 25 to 40° C. or so, and the immersion time is usually 10 to 300 seconds or 20 to 240 seconds or so, but is not limited thereto.

In the production procedure of the polarizer, a crosslinking process may also be performed. The crosslinking process can be performed using, for example, a crosslinking agent such as a boron compound. The order of such a crosslinking process is not particularly limited, and it can be performed, for example, together with a dyeing and/or stretching process, or proceed separately. For example, when a crosslinking agent is additionally combined in the above-mentioned dyeing solution, the crosslinking process may proceed simultaneously with dyeing. Such a crosslinking process may also be performed plural times. As the boron compound, boric acid or borax, and the like may be used. The boron compound can be generally used in the form of an aqueous solution or a mixed solution of water and an organic solvent, and usually an aqueous solution of boric acid is used. The boric acid concentration in the boric acid aqueous solution can be selected in an appropriate range in consideration of the degree of crosslinking and the heat resistance thereof, and the like. An iodinated compound such as potassium iodide can also be contained in a boric acid aqueous solution or the like.

The crosslinking process can be performed by immersing the PVA film or sheet in a boric acid aqueous solution or the like, where in this procedure, the treatment temperature is usually in a range of 25° C. or higher, 30° C. to 85° C. or 30° C. to 60° C. or so, and the treatment time is usually 5 seconds to 800 seconds or 8 seconds to 500 seconds or so, but is not limited thereto.

The stretching process is generally performed by uniaxial stretching. Such stretching may be performed together with the dyeing and/or crosslinking process. The stretching method is not particularly limited, and for example, a wet stretching method can be applied. In such a wet stretching method, for example, it is common to perform stretching after dyeing, but stretching may be performed together with crosslinking, which may also be performed plural times or in multiple stages.

An iodinated compound such as potassium iodide may be contained in the treatment liquid applied to the wet stretching method. In stretching, the treatment temperature is usually in a range of 25° C. or higher, 30° C. to 85° C. or 50° C. to 70° C., and the treatment time is usually 10 seconds to 800 seconds or 30 seconds to 500 seconds, but is not limited thereto.

The total draw ratio during the stretching procedure can be adjusted in consideration of orientation characteristics and the like, and the total draw ratio may be 3 to 10 times, 4 to 8 times, or 5 to 7 times, based on the original length of the PVA film or sheet, but is not limited thereto. Here, the total draw ratio may mean a cumulative draw ratio including the stretching in each process in the case of involving the stretching even in the swelling process or the like other than the stretching process. Such a total draw ratio can be adjusted in consideration of the orientation property, workability, or stretch cutting possibility, and the like.

In addition to the dyeing, crosslinking and stretching, the swelling process may also be performed before the processes are performed. It is possible to clean contamination or a blocking inhibitor of the PVA film or sheet surface by the swelling, whereby there is also an effect capable of reducing unevenness such as a dyeing deviation.

In the swelling process, water, distilled water or pure water, and the like can be usually used. The main component of the concerned treatment liquid is water, and if necessary, it may contain a small amount of an additive such as an iodinated compound such as potassium iodide or a surfactant, or an alcohol, and the like. In this procedure, it is also possible to adjust the above-described light blocking rate by controlling process variables.

The treatment temperature in the swelling process is usually about 20° C. to 45° C. or 20° C. to 40° C. or so, but is not limited thereto. Since the swelling deviations can cause the dyeing deviation, the process variables can be adjusted so that the occurrence of such swelling deviations is suppressed as much as possible.

Proper stretching can also be performed in the swelling process. The draw ratio may be 6.5 times or less, 1.2 to 6.5 times, 2 times to 4 times, or 2 times to 3 times or so, based on the original length of the PVA film. The stretching in the swelling procedure can reduce stretching in the stretching process performed after the swelling process and control it so that the breakage due to stretching of the film does not occur.

In the production procedure of the polarizer, metal ion treatment can be performed. This treatment is performed, for example, by immersing the PVA film in an aqueous solution containing a metal salt. This introduces the metal ions into the polarizer, where in this procedure, the color tone of the PVA polarizer can also be controlled by adjusting the kind or ratio of metal ions. The applicable metal ions can be exemplified by metal ions of a transition metal such as cobalt, nickel, zinc, chromium, aluminum, copper, manganese or iron, and the adjustment of the color tone may also be possible by selecting an appropriate type of these.

After the dyeing, crosslinking and stretching, a cleaning process may proceed. Such a cleaning process can be performed by an iodine compound solution such as potassium iodide.

Such cleaning with water and cleaning with the iodine compound solution may be combined, where a solution in which a liquid alcohol such as methanol, ethanol, isopropyl alcohol, butanol or propanol is combined may also be used.

After passing through such a process, the polarizer can be produced by performing a drying process. In the drying process, for example, it may be performed at an appropriate temperature for an appropriate time in consideration of the required moisture content and the like, and such conditions are not particularly limited.

The polarizer produced in such a manner may comprise a PVA film or sheet and an anisotropic absorbent material which is adsorbed and oriented on the PVA film or sheet. Here, the anisotropic absorbent material may be iodine, and in the present application, such a polarizer may be referred to as an iodine PVA polarizer.

Although the above description has been made on the iodine PVA polarizer among the known polarizers with respect to the polarizers applicable to the present application, the kind of the polarizers applicable in the present application is not limited to the above, and as long as the single transmittance for light having a wavelength of 390 nm falls within the above-described range, any kind of polarizer, among the various known polarizers, may also be applied in the present application.

In the circularly polarizing plate, a phase difference layer (e.g., 120) is present on one side of the polarizer. In the present application, the phase difference layer has blocking ability or absorbing ability against ultraviolet rays in a predetermined wavelength range in itself. For example, the phase difference layer may have transmittance for light having wavelengths of 385 nm, 390 nm, 395 nm, and/or 400 nm in a predetermined range.

For example, the phase difference layer may have transmittance of 3% or less for light having a wavelength of 385 nm. In another example, the transmittance may be 2.9% or less, 2.8% or less, 2.7% or less, 2.6% or less, 2.5% or less, 2.4% or less, 2.3% or less, 2.2% or less, 2.1% or less, 2.0% or less, 1.9% or less, 1.8% or less, 1.7% or less, 1.6% or less, 1.5% or less, or 1.4% or less. In addition, the transmittance may be 0% or more, 0.1% or more, 0.2% or more, 0.3% or more, 0.4% or more, 0.5% or more, 0.6% or more, 0.7% or more, 0.8% or more, 0.9% or more, 1.0% or more, 1.1% or more, 1.2% or more, 1.3% or more, 1.4% or more, 1.5% or more, 1.6% or more, or 1.65% or more.

For example, the phase difference layer may have transmittance of 15% or less for light having a wavelength of 390 nm. In another example, the transmittance may be 14% or less, 13% or less, 12% or less, 11% or less, 10% or less, 9% or less, 8% or less, 7% or less, 6% or less, 5% or less, 4% or less, or 3.5% or less. In addition, the transmittance may be 0% or more, 0.1% or more, 0.2% or more, 0.3% or more, 0.4% or more, 0.5% or more, 0.6% or more, 0.7% or more, 0.8% or more, 0.9% or more, 1% or more, 1.5% or more, 2% or more, 2.5% or more, 2.6% or more, 2.7% or more, 2.8% or more, 2.9% or more, 3.1% or more, 3.2% or more, 3.3% or more, 3.4% or more, 3.5% or more, or 3.6% or more.

For example, the phase difference layer may have transmittance of 25% or less for light having a wavelength of 395 nm. In another example, the transmittance may be 24% or less, 23% or less, 22% or less, 21% or less, 20% or less, 19% or less, 18% or less, 17% or less, 16% or less, 15, 14% or less, 13% or less, 12% or less, 11% or less, 10% or less, 9% or less, 8% or less, 7% or less, 6% or less, 5% or less, 4% or less, or 3.5% or less. In addition, the transmittance may be 0% or more, 0.1% or more, 0.2% or more, 0.3% or more, 0.4% or more, 0.5% or more, 0.6% or more, 0.7% or more, 0.8% or more, 0.9% or more, 1% or more, 1.5% or more, 2% or more, 2.5% or more, 3% or more, 3.5% or more, 4% or more, 4.5% or more, 5% or more, 5.5% or more, 6% or more, 6.5% or more, 7% or more, 7.5% or more, 8% or more, 8.5% or more, 9% or more, or 9.5% or more.

For example, the phase difference layer may have transmittance of 40% or less for light having a wavelength of 400 nm. In another example, the transmittance may be 39.5% or less, 39% or less, 38.5% or less, 38% or less, 37.5% or less, 37% or less, 36.5% or less, 36% or less, 35.5% or less, 35% or less, 34.5% or less, 34% or less, 33.5% or less, 33% or less, 32.5% or less, 32% or less, 31.5% or less, 31% or less, 30% or less, 29.5% or less, 29% or less, 28.5% or less, 28% or less, 27.5% or less, or 27% or less or so. In addition, the transmittance may be 0% or more, 0.1% or more, 0.2% or more, 0.3% or more, 0.4% or more, 0.5% or more, 0.6% or more, 0.7% or more, 0.8% or more, 0.9% or more, 1% or more, 1.5% or more, 2% or more, 2.5% or more, 3% or more, 3.5% or more, 4% or more, 4.5% or more, 5% or more, 5.5% or more, 6% or more, 6.5% or more, 7% or more, 7.5% or more, 8% or more, 8.5% or more, 9% or more, 9.5% or more, 10% or more, 10.5% or more, 11% or more, 11.5% or more, 12% or more, 12.5% or more, 13% or more, 13.5% or more, 14% or more, 14.5% or more, 15% or more, 15.5% or more, 16% or more, 16.5% or more, 17% or more, 17.5% or more, 18% or more, 18.5% or more, 19% or more, 19.5% or more, 20% or more, 20.5% or more, 21% or more, 21.5% or more, 22% or more, 22.5% or more, 23% or more, 23.5% or more, 24% or more, 24.5% or more, or 25% or more or so.

The transmittance of the phase difference layer can be measured using, for example, a spectrometer (N&K analyzer, N&K Technologies, INC). For example, the transmittance of the phase difference layer can be measured after the relevant phase difference layer sample is positioned on a base material which preferably exhibits no absorption peak at a wavelength of 380 nm or more, where a liquid crystal alignment film or the like may also be present between the base material and the phase difference layer. Here, the type of the base material which exhibits no absorption peak at a wavelength of 380 nm or more is not particularly limited, and for example, is an NRT base film or a TAC (triacetyl cellulose) base film (transmittance for 385 nm: 90.8%, transmittance for 390 nm: 91.1%, transmittance for 395 nm: 91.2%, or transmittance for 400 nm: 91.4%), and the like. For example, after the phase difference layer is positioned on the base material and the air is set to baseline, each transmittance is measured in a state of being vertically and horizontally aligned with the reference axis (slow axis) of the phase difference layer sample, and then the transmittance is calculated.

The phase difference layer having the transmittance characteristics designed as above can ensure that the circularly polarizing plate has stable durability while exhibiting a blocking property for light having a wavelength in the range of 380 to 400 nm.

In particular, this effect can be further improved in combination with the above-mentioned polarizer. That is, when the single transmittance of the polarizer and/or the transmittance of the phase difference do not satisfy the above-mentioned range, the ultraviolet blocking ability of the circularly polarizing plate, particularly the blocking ratio to light in the range of 380 to 400 nm is lowered, or the ultraviolet blocking ability is excessively given to any one of the polarizer and the phase difference layer, so that the durability of the circularly polarizing plate may be deteriorated.

In the present application, the ultraviolet blocking ability of the phase difference layer as above can also be realized without introducing an ultraviolet absorber or a light stabilizer, and the like into the phase difference layer separately. Therefore, in one example, the phase difference layer may not include an ultraviolet absorber or a light stabilizer, for example, an ultraviolet absorber or a light stabilizer, having a maximum absorption wavelength in the range of 385 nm to 400 nm. That is, when the phase difference layer is constituted by suitably combining a normal dispersion polymerizable liquid crystal compound and a reverse dispersion polymerizable liquid crystal compound as described below, the structural characteristics of the individual polymerizable liquid crystal compounds are complementary to each other, whereby the desired ultraviolet absorptivity can be ensured without applying an ultraviolet absorber or a light stabilizer and the like. By applying no ultraviolet absorber and light stabilizer in this way, it is possible to form a phase difference layer having excellent durability that does not cause poor orientation of liquid crystals by the additives or a bleeding-out phenomenon after formation of the phase difference layer, and the like.

In one example, the phase difference layer having the ultraviolet blocking ability can be realized by designing a reverse wavelength characteristic in the same manner as described below.

The phase difference layer may be a layer having a refractive index relationship according to any one of the following Equations 3 to 5.

$$nx > ny = nz \quad \text{[Equation 3]}$$

$$nx > ny > nz \quad \text{[Equation 4]}$$

$$nx > ny \text{ and } nz > ny \quad \text{[Equation 5]}$$

In Equations 3 to 5, nx, ny and nz are the refractive index in the x-axis direction (slow axis direction), the refractive index in the y-axis direction (fast axis direction) and the refractive index in the z-axis direction, respectively.

The phase difference layer included in the circularly polarizing plate may have, for example, planar phase difference within a range capable of having a quarter-wave phase delay characteristic. In this specification, the term n-wave phase delay characteristic means a characteristic that the incident light can be phase-delayed by n times the wavelength of the incident light within at least a part of the wavelength range. The quarter-wave phase delay characteristic may be a characteristic that the incident linearly polarized light is converted into elliptically polarized light or circularly polarized light and conversely, the incident linearly polarized light or circularly polarized light is converted into linearly polarized light. In one example, the phase difference layer may have a planar phase difference for light having a wavelength of 550 nm in a range of 90 nm to 300 nm. In another example, the planar phase difference may be 100 nm or more, 105 nm or more, 110 nm or more, 115 nm or more, 120 nm or more, 125 nm or more, or 130 nm or more. In addition, the planar phase difference may be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, or 145 nm or less.

For the phase difference layer, the range of the thickness direction phase difference obtained according to Equation 2 above is not particularly limited, which may be, for example, in a range of about −200 nm to 200 nm. In another example, the thickness direction phase difference may be −190 nm or more, −180 nm or more, −170 nm or more, −160 nm or more, −150 nm or more, −140 nm or more, −130 nm or more, −120 nm or more, −110 nm or more, −100 nm or more, −90 nm or more, −80 nm or more, −70 nm or more, −60 nm or more, −50 nm or more, −40 nm or more, −30 nm or more, −20 nm or more, or −10 nm or more. In addition, the thickness direction phase difference may be 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, 30 nm or less, 20 nm or less, or 10 nm or less.

In one example, the phase difference layer may be a layer satisfying the following equation 6.

$$R(450)/R(550) < R(650)/R(550) \quad \text{[Equation 6]}$$

In Equation 6, R (450) is the planar phase difference of the phase difference layer for light having a wavelength of 450 nm, R (550) is the planar phase difference of the phase difference layer for light having a wavelength of 550 nm, and R (650) is the planar phase difference of the phase difference layer for light having a wavelength of 650 nm.

Each of the planar phase differences complies with Equation 1 above, provided that in the planar phase difference for light having a wavelength of 450 nm, the refractive indexes for light having a wavelength of 450 nm are applied as nx and ny in Equation 1; in the planar phase difference for light having a wavelength of 550 nm, the refractive indexes for light having a wavelength of 550 nm are applied as nx and ny in Equation 1; and in the planar phase difference for light having a wavelength of 650 nm, the refractive indexes for light having a wavelength of 650 nm are applied as nx and ny in Equation 1.

The phase difference layer satisfying Equation 6 is a phase difference layer having a so-called reverse wavelength dispersion characteristic. Such a phase difference layer can exhibit the phase delay characteristic designed over a wide range of wavelengths.

It is possible to provide a circularly polarizing plate with better effects by controlling R (450)/R (550) and/or R (650)/R (550) in the phase difference layer satisfying Equation 6. In one example, R (450)/R (550) in Equation 6 above may be in a range of 0.6 to 0.99. In addition, R (450)/R (550) may be 0.61 or more, 0.62 or more, 0.63 or more, 0.64 or more, 0.65 or more, 0.66 or more, 0.67 or more, 0.69 or more, 0.70 or more, 0.71 or more, 0.72 or more, 0.73 or more, 0.74 or more, 0.75 or more, 0.76 or more, 0.77 or more, 0.78 or more, 0.79 or more, 0.80 or more, 0.81 or more, 0.82 or more, 0.83 or more, 0.84 or more, 0.85 or more, 0.86 or more, 0.87 or more, 0.88 or more, 0.89 or more, or 0.90 or more. In addition, the R (450)/R (550) may be 0.98 or less, 0.97 or less, 0.96 or less, 0.95 or less, 0.94 or less, 0.93 or less, 0.92 or less, 0.91 or less, 0.90 or less, 0.89 or less, 0.88 or more, 0.87 or more, 0.86 or less, or 0.85 or less. R (650)/R (550) in Equation 6 may be in a range of 1.00 to 1.19. The R (650)/R (550) may be 1.18 or less, 1.17 or less, 1.16 or less, 1.15 or less, 1.14 or less, 1.13 or less, 1.12 or less, 1.11 or less, 1.1 or less, or 1.08 or less or so. In addition, R (650)/R (550) in Equation 6 may be 1.01 or more, 1.02 or more, 1.03 or more, 1.04 or more, 1.05 or more, 1.06 or more, 1.07 or more, 1.08 or more, or 1.09 or more.

The method of adjusting R (450)/R (550) and/or R (650)/R (550) of the phase difference layer to the above range is not particularly limited, but in the present application, in order to secure the desired ultraviolet blocking ability even if the ultraviolet absorber or light stabilizer is not included, it can be realized by using two polymerizable liquid crystal compounds having different reverse wavelength characteristics as above, such compounds described below.

The phase difference layer may be laminated on one side of the polarizer so that its slow axis and the absorption axis of the polarizer may form an angle within a range of about 30 degrees to 60 degrees. In addition, the angle may be 35 degrees or more, or 40 degrees or more, and may also be 55 degrees or less, or 50 degrees or less.

As the phase difference layer, a known material can be used without particular limitation, as long as it has the transmittance characteristic and the planar phase difference.

For example, a stretched polymer layer or liquid crystal layer obtained by stretching a polymer film capable of imparting optical anisotropy by stretching in a suitable manner can be used. As the liquid crystal layer, a liquid crystal polymer layer or a cured layer of a polymerizable liquid crystal compound can be used.

Here, as the stretched polymer layer, for example, a polymer layer can be used, which comprises polyolefin such as polyethylene or polypropylene, a cyclic olefin polymer (COP) such as polynorbornene, polyvinyl chloride, polyacrylonitrile, polysulfone, an acrylic resin, polycarbonate, polyester such as polyethylene terephthalate, polyacrylate, polyvinyl alcohol, a cellulose ester-based polymer such as TAC (triacetyl cellulose), or a copolymer of two or more monomers among the monomers forming the polymer, and the like.

As the phase difference layer, various known materials as above can be used, but generally known phase difference layers often do not satisfy the above-mentioned characteristics, in particular, the transmittance characteristics for light having a wavelength of 385 nm, 390 nm, 395 nm, or 400 nm.

Therefore, for example, when the stretched polymer layer is intended to be applied as a phase difference layer, a process of adding an additive having an appropriate absorption property for the above-mentioned wavelength upon producing the polymer layer may be required.

It is advantageous to apply a liquid crystal polymer layer or a cured layer of a polymerizable liquid crystal composition as a phase difference layer in order to secure the desired transmittance characteristic in the above-mentioned wavelength range, and particularly, it is advantageous to apply a cured layer of a polymerizable liquid crystal composition comprising a polymerizable liquid crystal compound having a specific reverse wavelength characteristic to be described below.

Accordingly, the phase difference layer may comprise at least a polymerized unit of a normal dispersion polymerizable liquid crystal compound to be described below and a polymerization unit of a reverse dispersion polymerizable liquid crystal compound to be also described below. Here, the polymerized unit means a unit formed by polymerizing or curing the respective polymerizable liquid crystal compounds, as described below.

For example, in the present application, a phase difference layer can be manufactured by mixing two or more polymerizable liquid crystal compounds so as to satisfy the properties of Equation 6 above, and for example, a polymerizable liquid crystal compound having a low value of R (450)/R (550) (for example, a reverse dispersion polymerizable liquid crystal compound as described below) and a polymerizable liquid crystal compound having a high value of R (450)/R (550) (for example, a normal dispersion polymerizable liquid crystal compound as described below) can be combined to satisfy the properties of Equation 6 above.

In this specification, the term "polymerizable liquid crystal compound" may mean a compound containing a moiety capable of exhibiting liquid crystallinity, such as a mesogen skeleton, and also containing one or more polymerizable functional groups. Such polymerizable liquid crystal compounds are variously known under the so-called RM (reactive mesogen). The polymerizable liquid crystal compound may be contained in the polymerized form in the cured layer, that is, the above-described polymerized unit, which may mean a state where the liquid crystal compound is polymerized to form skeletons of the liquid crystal polymer such as main chains or side chains in the cured layer.

The polymerizable liquid crystal compound may be a monofunctional or multifunctional polymerizable liquid crystal compound. Here, the monofunctional polymerizable liquid crystal compound may be a compound having one polymerizable functional group and the multifunctional polymerizable liquid crystal compound may mean a compound containing two or more polymerizable functional groups. In one example, the polyfunctional polymerizable liquid crystal compound may comprise 2 to 10, 2 to 8, 2 to 6, 2 to 5, 2 to 4, 2 to 3, or 2 or 3 polymerizable functional groups.

It is known that a polymerizable liquid crystal composition prepared by combining such a polymerizable liquid crystal compound with other components such as an initiator, a stabilizer and/or a non-polymerizable liquid crystal compound is cured in a state where it is oriented on an alignment film to form the cured layer expressed with birefringence, and in the present application, the above-mentioned transmittance characteristics can be secured by controlling the properties of the polymerizable liquid crystal compound used in such a known process.

In one example, in order to secure the above-described transmittance characteristics, it is advantageous that the cured layer of the polymerizable liquid crystal composition comprising the reverse dispersion polymerizable liquid crystal compound is applied. Here, the reverse dispersion polymerizable liquid crystal compound means a polymerizable liquid crystal compound in which the liquid crystal layer (cured layer) formed by curing the polymerizable liquid crystal compound alone exhibits reverse wavelength dispersion characteristics, where the reverse wavelength characteristics mean the properties described by Equation 6 above.

In the present application, among the reverse dispersion polymerizable liquid crystal compounds, particularly, a liquid crystal compound having R (450)/R (550) of Equation 6 in a range of 0.6 to 0.99 can be applied. In addition, R (450)/R (550) of the reverse dispersion polymerizable liquid crystal compound may be 0.61 or more, 0.62 or more, 0.63 or more, 0.64 or more, 0.65 or more, 0.66 or more, 0.67 or more, 0.69 or more, 0.70 or more, 0.71 or more, 0.72 or more, 0.73 or more, 0.74 or more, 0.75 or more, 0.76 or more, 0.77 or more, 0.78 or more, 0.79 or more, 0.80 or more, 0.81 or more, 0.82 or more, 0.83 or more, 0.84 or more, 0.85 or more, 0.86 or more, 0.87 or more, 0.88 or more, 0.89 or more, or 0.90 or more. In addition, the R (450)/R (550) may be 0.98 or less, 0.97 or less, 0.96 or less, 0.95 or less, 0.94 or less, 0.93 or less, 0.92 or less, 0.91 or less, 0.90 or less, 0.89 or less, 0.88 or less, 0.87 or less, 0.86 or less, or 0.85 or less. Also, the reverse dispersion polymerizable liquid crystal compound may have R (650)/R (550) of Equation 6 in a range of 1.00 to 1.19. The R (650)/R (550) may be 1.18 or less, 1.17 or less, 1.16 or less, 1.15 or less, 1.14 or less, 1.13 or less, 1.12 or less, 1.11 or less, 1.1 or less, or 0.08 or less or so. In addition, the R (650)/R (550) may be 1.01 or more, 1.02 or more, 1.03 or more, 1.04 or more, 1.05 or more, 1.06 or more, 1.07 or more, 1.08 or more, or 1.09 or more or so. Among various known polymerizable liquid crystal compounds, particularly, in the case of the polymerizable liquid crystal compounds that the value of R (450)/R (550) is in the above-mentioned range, the present inventors have confirmed that the above-described transmittance characteristics are effectively satisfied by red shift of the UV absorption wavelength region, when it is combined with the normal dispersion polymerizable liquid crystal compound, as described below. In addition, the R (450)/R (550) may also be 0.6 or more, 0.61 or more, 0.62 or more, 0.63 or more, 0.64 or more, 0.65 or more, 0.66 or more, 0.67 or more, 0.68 or more, 0.69 or more, 0.70 or more, 0.71 or more, 0.72 or more, 0.73 or more, 0.74 or more, 0.75 or more, 0.76 or more, 0.77 or more, or 0.78 or more.

It is determined that this phenomenon is due to the inherent molecular structure of the reverse dispersion polymerizable liquid crystal compound designed to have R (450)/R (550) in the above range.

That is, the birefringence of the polymerizable liquid crystal compound is known to be mainly determined by a molecular conjugation structure, differential oscillator strength and order parameters, and the like, and in order for the polymerizable liquid crystal compound to exhibit high birefringence, large electron density in the direction of the main axis is required, and thus most of the polymerizable liquid crystal compounds have a highly conjugated shape in the long axis direction.

However, in order for the polymerizable liquid crystal compound to exhibit the reverse dispersion property, it is necessary to adjust the birefringence between the long axis and the axis perpendicular thereto, and accordingly, the polymerizable liquid crystal compound designed to have the reverse dispersion property has mostly a molecular shape in the form of T or H, and simultaneously is a shape that the main axis (long axis) has a large phase difference and a small dispersion value, and the axis perpendicular thereto has a small phase difference and a large dispersion value.

However, since the electronic transition ($\pi \rightarrow \pi^*$) that absorbs light in the range of 180 nm to 400 nm as the ultraviolet region shifts to a longer wavelength as the conjugation length becomes longer, the polymerizable liquid crystal compound designed to have the reverse dispersion characteristic highly conjugates the negative birefringent portion to cause a red shift phenomenon in which the ultraviolet absorption wavelength region is shifted to a longer wavelength.

The present inventors have confirmed that among the reverse dispersion polymerizable liquid crystal compounds having the above characteristics, particularly, the polymerizable liquid crystal compound designed so that the range of R (450)/R (550) is in the above-mentioned range exhibits the appropriate range of red shift capable of satisfying the transmittance characteristics required in the present application.

In particular, in the case of the reverse dispersion polymerizable liquid crystal compound having the following structure, the present inventors have confirmed that while it exhibits the desired ultraviolet blocking ability when it has been mixed with the normal dispersion polymerizable liquid crystal compound, its phase difference properties (R (450)/R (550) and R (650)/R (550)) can also be effectively designed according to the purpose.

[Formula 1]

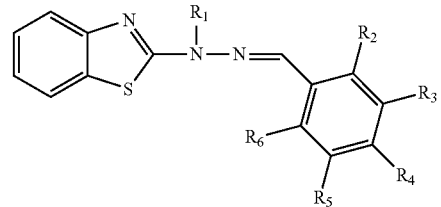

In Formula 1, $R_1$ is a substituent of the following formula 2 or 3, and $R_2$ to $R_6$ are each independently hydrogen, an alkyl group, an alkoxy group, a cyano group, a substituent of the following formula 4 or a substituent of the following formula 5. Here, at least two or more or two of $R_2$ to $R_6$ are also substituents of the following formula 4 or substituents of the following formula 5.

For example, in Formula 1, any one of $R_2$ and $R_3$ and any one of $R_5$ and $R_6$ may be a substituent of the following formula 4 or 5.

-A$_1$-L$_1$-Cyc-A$_2$-L$_2$-P  [Formula 2]

In Formula 2, $A_1$ and $A_2$ are each independently an oxygen atom or a single bond, $L_1$ and $L_2$ are each independently —C(=O)—O—, —O—C(=O)— or an alkylene group, Cyc is an arylene group or a cycloalkylene group, and P is a polymerizable functional group.

[Formula 3]

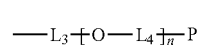

In Formula 3, $L_3$ and $L_4$ are each an alkylene group, n is a number in a range of 1 to 4, and P is a polymerizable functional group or a hydrogen atom.

$$-A_3-L_5-Cyc-A_4-L_6-P \quad \text{[Formula 4]}$$

In Formula 4, $A_3$ and $A_4$ are an oxygen atom, an alkylene group or a single bond, $L_5$ and $L_6$ are each independently —C(=O)—O—, —O—C(=O)— or an alkylene group, Cyc is an arylene group, and P is a polymerizable functional group.

$$-A_5-L_7-Cy_1-A_6-L_8-Cy_2-A_7-L_9-P \quad \text{[Formula 5]}$$

In Formula 5, $A_5$, $A_6$ and $A_7$ are each independently an oxygen atom or a single bond, $L_7$, $L_8$ and $L_9$ are each independently —C(=O)—O—, —O—C(=O)— or an alkylene group, Cy1 is a cycloalkylene group, Cy2 is an arylene group, and P is a polymerizable functional group.

In Formulas 1 to 5 above, the term single bond is a case where there is no separate atom at the corresponding site, and for example, if $A_2$ in Formula 2 is a single bond, there is no separate atom in $A_2$ and a structure in which Cyc is directly connected to $L_2$ can be implemented.

In Formulas 1 to 5 above, the term alkyl group, alkoxy group or alkylene group may be a linear or branched alkyl group, alkoxy group or alkylene group, having 1 to 20 carbon atoms, 1 to 16 carbon atoms, 1 to 12 carbon atoms, 1 to 8 carbon atoms, or 1 to 4 carbon atoms, which may optionally be substituted by one or more substituents.

Also, in Formulas 1 to 5 above, the arylene group may be an arylene group having 6 to 12 carbon atoms or may be a phenylene group.

Furthermore, in Formulas 1 to 5 above, the cycloalkylene group may be a cycloalkylene group having 3 to 12 carbon atoms or 3 to 9 carbon atoms, or may be a cyclohexylene group.

In the substituents of Formula 2, $A_1$ may be a single bond, $L_1$ may be —C(=O)—O— or —O—C(=O)—, $A_2$ may be an oxygen atom, and $L_2$ may be an alkylene group having 3 or more, 4 or more, or 5 or more carbon atoms. The carbon number of the alkylene group in $L_2$ may be 12 or less, or 8 or less.

In one example of Formula 3 above, $L_3$ and $L_4$ may each independently be an alkylene group having 1 to 4 carbon atoms, n may be a number in a range of 1 to 3 or a number in a range of 1 to 2, or may be 2, and P may be a polymerizable functional group. Also, in this case, when the number of units of [O-$L_4$] in Formula 3 is 2 or more, the carbon number of the alkylene group of $L_4$ in each unit may be the same or different.

Also, in another example of Formula 3 above, $L_3$ and $L_4$ may each independently be an alkylene group having 1 to 4 carbon atoms, n may be a number in a range of 1 to 3 or a number in a range of 1 to 2, or may be 2, and P may be a hydrogen atom. Furthermore, in this case, when the number of units of [O-$L_4$] in Formula 3 is 2 or more, the carbon number of the alkylene group of $L_4$ in each unit may be the same or different.

In Formula 4, $A_3$ may be a single bond or may be an alkylene group having 1 to 4 carbon atoms, $L_5$ may be —C(=O)—O— or —O—C(=O)—, $A_4$ may be an oxygen atom, $L_6$ may be an alkylene group having 3 or more, 4 or more, or 5 or more carbon atoms. The carbon number of the alkylene group in $L_6$ may be 12 or less or 8 or less.

In Formula 5, $A_5$ may be an oxygen atom, $L_7$ may be an alkylene group having 1 to 4 carbon atoms, $A_6$ may be a single bond, $L_8$ may be —C(=O)—O— or —O—C(=O)—, $A_7$ may be an oxygen atom, and $L_9$ may be an alkylene group having 3 or more, 4 or more, or 5 or more carbon atoms. The carbon number of the alkylene group in $L_9$ may be 12 or less, or 8 or less.

The present inventors have confirmed that such a polymerizable liquid crystal compound can effectively satisfy the desired physical properties by a unique T type structure and a conjugated structure realized by centering on N—N bonds.

In the above formulas, the kind of the polymerizable functional group is not particularly limited, which may be, for example, an acryloyl group, a methacryloyl group, an acryloyloxy group or a methacryloyloxy group.

In one example, it may be advantageous that as the reverse dispersion polymerizable liquid crystal compound, a compound, wherein, in Formula 1 above, $R_1$ is a substituent of Formula 3 above, and at least two or more or two of $R_2$ to $R_6$ are substituents of Formula 5 above, is used.

If necessary, a liquid crystal compound that $R_1$ in Formula 1 above is a substituent of Formula 3 above, wherein P is a polymerizable functional group, and a liquid crystal compound that $R_1$ in Formula 1 above is a substituent of Formula 3 above, wherein P is a hydrogen atom, can be mixed and used, and in this case, the mixing ratio is determined according to the desired reverse wavelength characteristics (R (450)/R (550) and/or R (650)/R (550)), which is not particularly limited.

The polymerized units of the reverse dispersion polymerizable liquid crystal compound may be contained in the cured layer (liquid crystal layer) in a ratio of 40 wt % or more based on the weight of the polymerized units of the entire polymerizable liquid crystal compound. In another example, the ratio may also be about 45 wt % or more, 50 wt % or more, 55 wt % or more, 60 wt % or more, 65 wt % or more, 70 wt % or more, 75 wt % or more, 80 wt % or more, 85 wt % or more, 80 wt % or more, or 95 wt % or more. The phase difference layer (liquid crystal layer) may contain only polymerized units of the liquid crystal compound of the Formula 1 above as the polymerizable liquid crystal compound, but from the viewpoint of realization of appropriate physical properties, it is advantageous that the normal dispersion polymerizable liquid crystal compound to be described below is contained together. Accordingly, the ratio may be 100 wt % or less or less than 100 wt %.

The polymerizable liquid crystal composition and/or the cured layer (liquid crystal layer) may further comprise, in addition to the reverse dispersion polymerizable liquid crystal compound, a polymerizable liquid crystal compound in which in Equation 6, R (450)/R (550) is in a range of 1.04 to 1.25, 1.04 to 1.15 or 1.06 to 1.15 (hereinafter, normal dispersion polymerizable liquid crystal compound). The application of the reverse dispersion polymerizable liquid crystal compound having the above-mentioned R (450)/R (550) is advantageous in that the cured layer (liquid crystal layer) exhibits the desired transmittance characteristics, but it is disadvantageous that as the value of R (450)/R (550) is somewhat low, the cured layer (liquid crystal layer) exhibits a reverse dispersion characteristic as a whole. Therefore, in order to overcome this disadvantage, the polymerizable liquid crystal compound having the R (450)/R (550) value in the above range may be added in the polymerizable liquid crystal composition and/or the cured layer to control the overall optical properties. The normal dispersion liquid crystal compound may have R (650)/R (550) of Equation 6 in a range of about 0.8 to 0.99, about 0.85 to 0.99, about 0.9 to 0.99, or about 0.91 to 0.99.

Such normal dispersion polymerizable liquid crystal compounds are variously known, and for example, polymerizable liquid crystal compounds known in Korean Patent No.

1729819, Korean Patent No. 1640670, Korean Patent No. 1557202, Korean Patent No. 1472187, Korean Patent No. 1460862, Korean Patent No. 1191124, Korean Patent No. 1191125 and/or Korean Patent No. 1191129 and the like can be used.

As such a normal dispersion polymerizable liquid crystal compound, various known materials can be used, but in order to secure the desired physical properties by complementing miscibility with the previously described reverse dispersion polymerizable liquid crystal compound or ultraviolet absorptivity of the reverse dispersion polymerizable liquid crystal compound, it may be advantageous to use a compound represented by the following Formula 6.

[Formula 6]

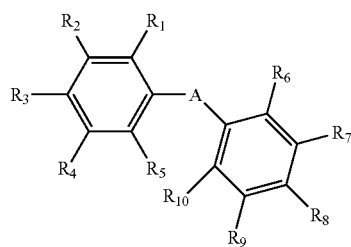

In Formula 6, A may be a single bond, —C(=O)O— or —OC(=O)— and $R_1$ to $R_{10}$ may each independently be hydrogen, halogen, an alkyl group, an alkoxy group, an alkoxycarbonyl group, a cyano group, a nitro group or a substituent of Formula 7 below. Also, in another example, two neighboring substituents of $R_1$ to $R_5$ or two neighboring substituents of $R_6$ to $R_{10}$ in the structure may be bonded to each other to constitute a benzene ring substituted with -L-A-P. For example, when two neighboring substituents of $R_1$ to $R_5$ form benzene substituted with -L-A-P, a naphthalene structure substituted with -L-A-P can be realized on the left side based on A in Formula 6 above, and when two neighboring substituents of $R_6$ to $R_{10}$ form benzene substituted with -L-A-P, a naphthalene structure substituted with -L-A-P can be realized on the right side based on A in Formula 6 above. Here, L may be —C(=O)O—, —OC(=O)— or —OC(=O)O—, A may be an alkylene group, and P may be a polymerizable functional group. Here, the alkylene of A may be an alkylene group having 1 or more, 2 or more, 3 or more, or 4 or more carbon atoms, and the carbon number of the alkylene group may be 20 or less, 16 or less, 12 or less, or 8 or less. Also, here, the polymerizable functional group P may be an acryloyl group, a methacryloyl group, an acryloyloxy group or a methacryloyloxy group. Here, when two neighboring substituents of $R_1$ to $R_5$ or two neighboring substituents of $R_6$ to $R_{10}$ are bonded to each other to constitute the benzene ring, the remaining substituents may be hydrogen, halogen, an alkyl group, an alkoxy group, an alkoxycarbonyl group, a cyano group or a nitro group, as described above.

[Formula 7]

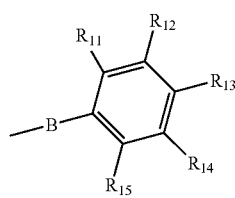

In Formula 7, B may be a single bond, —C(=O)O— or —OC(=O)—, and $R_{11}$ to $R_{15}$ may each independently be hydrogen, halogen, an alkyl group, an alkoxy group, an alkoxycarbonyl group, a cyano group, a nitro group or the -L-A-P, or two neighboring substituents of $R_{11}$ to $R_{15}$ may be bonded to each other to constitute a benzene ring substituted with -L-A-P. In this case, the structure of Formula 7 has a naphthalene structure substituted with -L-A-P. Here, when two neighboring substituents of $R_{11}$ to $R_{15}$ are bonded to each other to constitute the benzene ring, the remaining substituents may be hydrogen, halogen, an alkyl group, an alkoxy group, an alkoxycarbonyl group, a cyano group or a nitro group, as described above.

The meaning of the single bond in Formulas 6 and 7 above is the same as the case of Formulas 1 to 5 above, and the meanings of the alkyl group and the alkoxy group are also the same as the case of Formulas 1 to 5 above.

In one example, as $R_2$ and $R_3$ or $R_3$ and $R_4$ in Formula 6 above form benzene substituted with the -L-A-P, a compound in which the left side of A in Formula 6 above forms a naphthalene structure can be used as the normal dispersion polymerizable liquid crystal compound.

As the normal dispersion polymerizable liquid crystal compound, a compound in which any one of $R_7$ to $R_9$ in Formula 6 above, for example, $R_8$ is Formula 7 above can also be used. In this case, as $R_{12}$ and $R_{13}$ or $R_{13}$ and $R_{10}$ in Formula 7 above form benzene substituted with the -L-A-P, a compound in which the right side of B in Formula 7 above forms a naphthalene structure can be used.

The ratio of such a normal dispersion polymerizable liquid crystal compound in the cured layer (liquid crystal layer) is not particularly limited, as long as while the transmittance characteristic of the cured layer (liquid crystal layer) is maintained in the desired range, the optical properties such as the R (450)/R (550) value of the entire cured layer (liquid crystal layer) can be maintained in the desired range. For example, the normal dispersion polymerizable liquid crystal compound may be contained in a ratio of 0 to 60 wt % or a ratio of more than 0 wt % and 60 wt % or less. In addition, the ratio may also be about 55 wt % or less, 50 wt % or less, 45 wt % or less, 40 wt % or less, 35 wt % or less, 30 wt % or less, 25 wt % or less, 20 wt % or less, 15 wt % or less, 10 wt % or less, or 5 wt % or less or so. Within this range, the cured layer (liquid crystal layer) can exhibit suitable reverse dispersion characteristics and transmittance characteristics. Therefore, the ratio of the normal dispersion polymerizable liquid crystal compound in the polymerizable liquid crystal composition may be within a range in which the normal dispersion polymerizable liquid crystal compound in the formed cured layer can be present in the above-mentioned range.

The cured layer (liquid crystal layer) may comprise polymerized units of a polymerizable liquid crystal compound having tri-functionality or more, for example, a polymerizable liquid crystal compound having 3 to 10, 3 to 8, 3 to 6, 3 to 5, 3 to 4, or 3 polymerizable functional groups. Such a polymerizable liquid crystal compound having tri-functionality or more may be the above-mentioned reverse dispersion or normal dispersion polymerizable liquid crystal compound. The ratio of polymerized units of the polymerizable liquid crystal compound in the cured layer (liquid crystal layer) is not particularly limited, but it may be, for example, 30 wt % or more, or 40 wt % or more and may be 100 wt % or less, or may be less than 100 wt %. The cured layer (liquid crystal layer) comprising polymerized units of the polymerizable liquid crystal compound having tri-functionality or more in such a ratio can exhibit more excellent durability.

In the cured layer (liquid crystal layer) of the polymerizable liquid crystal composition comprising the polymerizable liquid crystal compound as described above, the conversion ratio of the polymerizable liquid crystal compound, that is, the ratio of the polymerizable liquid crystal compound converted from the initial monomer state into the polymerized state may be, for example, 50 wt % to 100 wt % or so. In another example, the conversion ratio may be about 60 to 100 wt % or about 70 to 100 wt % or so. At such a conversion ratio, the cured layer (liquid crystal layer) can exhibit improved durability.

In particular, since the phase difference layer of the present application realizes the desired ultraviolet absorbing ability through application of normal dispersion and reverse dispersion polymerizable liquid crystal compounds having a specific structure without using an ultraviolet absorber or a light stabilizer, as described above, it can exhibit excellent durability.

For example, the phase difference layer may have an absolute value of the phase difference change ratio according to the following Equation A of about 17% or less, about 16.5% or less, about 16% or less, or about 15.5% or less. In addition, the phase difference change ratio may be about 0% or more, 2% or more, 4% or more, 6% or more, 8% or more, 10% or more, 12% or more, or 14% or more.

$$\text{Phase difference change ratio} = 100 \times (Ra-Ri)/Ri \quad \text{[Equation A]}$$

In Equation A, Ri is the initial in-plane phase difference of the phase difference layer for a wavelength of 550 nm, and Ra is the in-plane phase difference of the phase difference layer for a wavelength of 550 nm, after an endurance condition.

Here, the endurance condition is to maintain the phase difference layer at 85° C., and specifically, the phase difference change ratio can be measured by the method disclosed in the following examples. Here, the holding time at the endurance condition may be 50 hours or more, 100 hours or more, 150 hours or more, 200 hours or more, or 250 hours or more. In addition, the holding time may also be about 300 hours or less.

The circularly polarizing plate of the present application may further comprise a base film present on the lower part of the phase difference layer.

According to one example of the present application, the phase difference layer can be formed by coating a liquid crystal composition on the base film. The coating method is not particularly limited, which may be performed, for example, by coating through a known coating method such as roll coating, printing method, ink jet coating, slit nozzle method, bar coating, comma coating, spin coating or gravure coating. The phase difference layer can be formed by polymerizing or curing a liquid crystal composition coated on the base film. The polymerization or curing method of the liquid crystal composition is not particularly limited, which may be performed by a known liquid crystal compound polymerization or curing method. For example, it can be performed by a method of maintaining an appropriate temperature or a method of irradiating it with an appropriate active energy ray so that the polymerization reaction or the curing reaction of the liquid crystal compound can be initiated. When the maintenance at an appropriate temperature and the irradiation of an active energy ray are simultaneously required, the above processes can proceed sequentially or simultaneously. Here, The irradiation of the active energy ray may be performed using, for example, a high-pressure mercury lamp, an electrodeless lamp or a xenon lamp, and the like, and the conditions such as the wavelength, light intensity or light quantity of the irradiated active energy ray can be selected within a range that the curing or polymerization of the liquid crystal composition can be suitably performed.

When the phase difference layer is formed by coating it on the base film as described above, a separate pressure-sensitive adhesive layer or adhesive layer for laminating the phase difference layer and the base film is not required. Accordingly, a pressure-sensitive adhesive layer or an adhesive layer may not be included between the phase difference layer and the base film.

When the phase difference layer is formed by coating it on the base film as described above, a primer layer and/or a liquid crystal alignment film may be formed on the base film. Therefore, a primer layer or a liquid crystal alignment film may be present between the phase difference layer and the base film. In one example, the base film, the primer layer, the liquid crystal alignment film and the phase difference layer may be laminated in this order. The primer layer has preferably solvent resistance for suppressing a change in the phase difference value of the base film upon coating the liquid crystal alignment film or the liquid crystal composition on the base film. The primer layer can be used even from the viewpoint of adhesion or slipperiness. The primer layer may be formed by a method of coating it on the base film separately or coating it on a film fabric and stretching it.

The circularly polarizing plate of the present application may have various other structures as long as the polarizer, the retarder layer and the base film are basically included.

For example, the circularly polarizing plate may comprise an additional layer (hereinafter, outer layer) laminated on the opposite surface of the polarizer facing the phase difference layer. FIG. 3 is an example of a case where the outer layer (301) is formed on the upper part of the polarizer (101).

As the type of the outer layer (e.g., 301), a polarizer protective film, a hard coating layer, a phase difference film, an antireflection layer or a liquid crystal coating layer, and the like can be exemplified, without being limited thereto. The specific type of each constitution used as the outer layer is not particularly limited, and for example, various kinds of films used for constituting an optical film such as a polarizing plate in the industry can be used without limitation.

For example, the outer layer may be an optical film having a planar phase difference of 10 nm or less for a wavelength of 550 nm. The optical film may be a protective film of the polarizer. As the protective film, various films known in the industry can be applied.

The outer layer may also be a retardation layer having a quarter-wave phase delay characteristic. Such a retardation layer can be configured by using a phase difference film or a liquid crystal coating layer among the above-mentioned outer layers. Therefore, the circularly polarizing plate may further comprise an optical film (retardation layer) laminated on the opposite surface of the polarizer facing the phase difference layer and having a planar phase difference in a range of 90 nm to 300 nm for a wavelength of 550 nm. In another example, the planar phase difference of the retardation layer may be 100 nm or more, 105 nm or more, 110 nm or more, 115 nm or more, 120 nm or more, 125 nm or more, or 130 nm or more. Also, the planar phase difference may be 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, or 145 nm or less.

The above-mentioned outer layer may be a single layer or a multilayer structure. An example of the single layer structure can be exemplified by a single layer structure of the polarizer protective film or a single layer structure of the phase difference film, which is the retardation layer having the quarter-wave phase delay characteristic, and the like, and the multilayer structure can be exemplified by a structure in which a hard coating layer, a liquid crystal coating layer having a quarter-wave phase delay characteristic and/or an antireflection layer are formed on the polarizer protective film and/or the phase difference film, and the hard coating layer, the liquid crystal having a quarter-wave phase delay characteristic and the antireflection layer, and the like may be present as any one layer of them, or may also be present as a multilayer of two or more layers.

The circularly polarizing plate may further comprise an additional layer (hereinafter, lower layer) laminated on the opposite side of the surface of the base film facing the polarizer.

FIG. 4 is an example of a case where the lower layer (401) is formed on the lower part of the base film (103). In the same case as FIG. 4, the same outer layer (301) as FIG. 3 may also be added. For example, as in FIG. 4, in the state where the lower layer (401) is present, an outer layer such as a hard coating layer or a low reflection layer may exist on the outer side of the polarizer (101), and a protective film may also exist on one side or both sides of the polarizer (101).

The type of the lower layer can be exemplified by a retardation layer, or a pressure-sensitive adhesive layer or an adhesive layer for attaching the circularly polarizing plate to another element, or a protective film or a release film for protecting the pressure-sensitive adhesive layer or the adhesive layer.

When a retardation layer is used as the lower layer, the layer satisfying the refractive index relationship of the following Equation 5 or 7 may be applied. The addition of such a layer allows the circularly polarizing plate to exhibit the desired properties for the light incident in the oblique direction.

$$nx > ny \text{ and } nz > ny \qquad \text{[Equation 5]}$$

$$nx = ny < nz \qquad \text{[Equation 7]}$$

In Equations 5 and 7 above, nx, ny and nz are as defined in Equations 1 and 2 above.

The circularly polarizing plate may further comprise an optical film, as a retardation layer which is the lower layer, present on the lower part of the phase difference layer and having thickness direction phase difference in a range of 10 to 400 nm. The optical film may be a retardation layer satisfying the refractive index relationship of Equation 5 or 7 above.

In another example, the upper limit of the thickness direction phase difference of the optical film may be 370 nm or less, 350 nm or less, 330 nm or less, 300 nm or less, 270 nm, 250 nm, 240 nm, 230 nm, 220 nm, 200 nm, 190 nm, 180 nm, 170 nm, 160 nm, 155 nm, 150 nm, 130 nm, 120 nm, 110 nm, 100 nm, 80 nm or 70 nm. In addition, the lower limit of the thickness direction phase difference of the optical film may be 5 nm, 10 nm, 20 nm, 40 nm, 50 nm, 90 nm, 100 nm, 110 nm, 120 nm or 150 nm. It is possible to provide a circularly polarizing plate having excellent reflection characteristics and luminosity characteristics, in particular, reflection characteristics and visual sensitivity characteristics at an oblique angle, by adjusting the thickness direction phase difference of the optical film as above.

When the optical film is an optical film satisfying Equation 5 above, the planar phase difference thereof may be, for example, more than 0 nm and 300 nm or less, 290 nm or less, 280 nm or less, 270 nm or less, 260 nm or less, 250 nm or less, 240 nm or less, 230 nm or less, 220 nm or less, 210 nm or less, 200 nm or less, 190 nm or less, 180 nm or less, 170 nm or less, 160 nm or less, 150 nm or less, 140 nm or less, 130 nm or less, 120 nm or less, 110 nm or less, 100 nm or less, 90 nm or less, 80 nm or less, 70 nm or less, 60 nm or less, 50 nm or less, 40 nm or less, 30 nm or less, 20 nm or less, or 10 nm or less.

Furthermore, when the optical film is an optical film satisfying Equation 5 above, the optical film may be arranged such that its slow axis is perpendicular or horizontal to the absorption axis of the polarizer. In this specification, the term vertical, orthogonal, horizontal or parallel means substantially vertical, orthogonal, horizontal or parallel in a range that does not impair the desired effect. Therefore, the terms may each include, for example, an error within ±15 degrees, within ±10 degrees, within ±5 degrees, or within ±3 degrees.

In another example, when the optical film is an optical film satisfying Equation 5 above, it may also be arranged such that its slow axis may form an angle in a range of about 30 to 60 degrees with the absorption axis of the polarizer. In addition, the angle may be 35 degrees or more, or 40 degrees or more, and also may be 55 degrees or less, or 50 degrees or less.

In the circularly polarizing plate, a separate layer may or may not exist between the polarizer and the phase difference layer.

Here, the case that no separate layer exists between the polarizer and the phase difference layer is the case that the polarizer and the phase difference layer are directly attached, where in this case, other layers may not be present except for a layer for bonding the polarizer and the phase difference layer, for example, a pressure-sensitive adhesive layer, an adhesive layer and/or a primer layer, and the like.

In addition, even when a separate layer exists or does not exist between the polarizer and the phase difference layer, no birefringent layer may exist at least between the polarizer and the phase difference layer. In this case, the birefringent layer means a layer having at least one of the planar phase difference and the thickness direction phase difference of 10 nm or more.

FIG. 5 is an example of a case where a separate layer (middle layer) (501) exists between the polarizer (101) and the phase difference layer (102). The middle layer can be exemplified by the polarizer protective film or retardation layer as described above. Although not shown even in the structure of FIG. 5, the outer layer (301) of the structure of FIG. 3 and/or the lower layer (401) of the structure of FIG. 4 may also be present.

For example, the circularly polarizing plate may further comprise an optical film present between the polarizer and the phase difference layer, and having a planar phase difference of 5 nm or less for a wavelength of 550 nm, and a thickness direction phase difference for a wavelength of 550 nm in a range of −60 nm to 0 nm, where this optical film may be, for example, a protective film of a polarizer.

In another example, the circularly polarizing plate may further comprise an optical film present between the polarizer and the phase difference layer and having a planar phase difference for a wavelength of 550 nm of 10 nm or less, and a thickness direction phase difference for a wavelength of 550 nm in a range of 40 nm to 400 nm. Such an optical film may be a retardation layer, which may be, for example, a layer satisfying any one of refractive index relationships of Equations 3 to 5, 7 and 8, or may be a spray-oriented liquid crystal cured layer, or a tilt-oriented liquid crystal cured layer.

In one example, the circularly polarizing plate may further comprise an optically anisotropic layer present between the polarizer and the phase difference layer and having a retardation layer which satisfies the following equation 8 or has Nz of −4.0 or less in the following equation 9.

$$nx=ny<nz \quad \text{[Equation 8]}$$

$$Nz=(nx-nz)/(nx-ny) \quad \text{[Equation 9]}$$

In Equations 8 and 9, nx is the refractive index in the slow axis direction of the retardation layer, ny is the refractive index in the fast axis direction of the retardation layer, and nz is the refractive index in the thickness direction of the retardation layer.

Also, in this case, the optically anisotropic layer may further comprise a retardation layer that the Nz value in Equation 9 is in the range of 0.8 to 1.2, and the in-plane slow axis is parallel or orthogonal to the absorption axis of the polarizer.

For example, the retardation layer having Nz of −4.0 or less in Equation 9 or satisfying Equation 8 is adjacent to the polarizer as compared with the retardation layer having the Nz value of Equation 9 above in the range of 0.8 to 1.2, and the in-plane slow axis of the retardation layer having the Nz value of Equation 9 above in the range of 0.8 to 1.2 can be arranged to be parallel to the absorption axis of the polarizer.

In addition, the retardation layer having the Nz value of Equation 9 above in the range of 0.8 to 1.2 is adjacent to the polarizer as compared with the retardation layer having the Nz in Equation 9 above of −4.0 or less or satisfying Equation 8, and the in-plane slow axis of the retardation layer having the Nz value of Equation 9 above in the range of 0.8 to 1.2 may also be orthogonal to the absorption axis of the polarizer.

Furthermore, the retardation layer having the Nz value of Equation 9 in the range of 0.8 to 1.2 is adjacent to the polarizer as compared with the retardation layer having the Nz of −4.0 or less in Equation 9 above or satisfying Equation 8, and the in-plane slow axis of the retardation layer having the Nz value of Equation 9 above in the range of 0.8 to 1.2 may also be parallel to the absorption axis of the polarizer.

In addition, the retardation layer having Nz of −4.0 or less in Equation 9 above or satisfying Equation 8 is adjacent to the polarizer as compared with the retardation layer having the Nz value of Equation 9 above in the range of 0.8 to 1.2, and the in-plane slow axis of the retardation layer having the Nz value of Equation 9 above in the range of 0.8 to 1.2 may also be arranged to be orthogonal to the absorption axis of the polarizer.

In this case, the thickness direction phase difference of the retardation layer having the Nz of −4.0 or less in Equation 9 above or satisfying Equation 8 may be in a range of 30 nm to 200 nm, and the Nz value of Equation 9 above may be −4.0 or less.

In addition, the planar phase difference of the retardation layer having the Nz value of Equation 9 above in the range of 0.8 to 1.2 may be in a range of 30 nm to 180 nm for light having a wavelength of 550 nm.

In another example, the circularly polarizing plate may further comprise a retardation layer present between the polarizer and the phase difference layer and satisfying Equation 6 above.

In this case, the planar phase difference of the retardation layer may be in a range of 70 to 200 nm, and the in-plane slow axis thereof may be parallel or orthogonal to the absorption axis of the polarizer. Also, the Nz of the retardation layer according to Equation 9 above may be in a range of −0.2 to 0.8.

In another example, the circularly polarizing plate may further comprise a retardation layer having a plurality of optical axes whose inclination angles vary along the thickness direction, for example, a spray-oriented liquid crystal cured layer between the polarizer and the phase difference layer.

The projection of all the optical axes of the retardation layer onto the plane may be parallel or orthogonal to the absorption axis of the polarizer.

When the retardation layer is a liquid crystal cured layer, the cured layer may comprise a liquid crystal material having refractive index anisotropy of 0.03 to 0.2.

Also, the liquid crystal cured layer may comprise rod-shaped liquid crystal molecules or may include disk-shaped liquid crystal molecules.

In this case, the optical axis of the retardation layer may be gradually changing along the thickness direction of the retardation layer such that the inclination angle is 70 degrees to 90 degrees on one surface of the retardation layer and the inclination angle is 0 degrees to 20 degrees on the other surface facing it.

When the rod-shaped liquid crystal molecules are included, the optical axis may be gradually changing along the thickness direction such that the inclination angle of the optical axis of the retardation layer is 70 degrees to 90 degrees on both surfaces of the retardation layer, respectively and it is 0 degrees to 70 degrees in the middle portion in the thickness direction.

When the rod-shaped liquid crystal molecules are included, the optical axis may be gradually changing along the thickness direction such that the inclination angle of the optical axis of the retardation layer is 0 degrees to 20 degrees on both surfaces of the retardation layer, respectively and it is 40 degrees to 90 degrees in the middle portion in the thickness direction.

When the disk-shaped liquid crystal molecules are included, the optical axis may be gradually changing along the thickness direction such that the inclination angle of the optical axis of the retardation layer is 70 degrees to 90 degrees on both surfaces of the retardation layer, respectively and it is 0 degrees to 30 degrees in the middle portion in the thickness direction.

When the disk-shaped liquid crystal molecules are included, the optical axis may be gradually changing along the thickness direction such that the inclination angle of the optical axis of the retardation layer is 0 degrees to 20 degrees on both surfaces of the retardation layer, respectively and it is 20 degrees to 50 degrees in the middle portion in the thickness direction.

Also, in another example, the circularly polarizing plate may further comprise a retardation layer having an optical axis inclined uniformly along the thickness direction, for example, a tilt-oriented liquid crystal cured layer between the polarizer and the phase difference layer.

Here, the projection of the retardation layer onto the plane of the optical axis can be parallel to the absorption axis of the polarizer.

The retardation layer, which is a liquid crystal cured layer, may comprise liquid crystal molecules having refractive index anisotropy in a range of 0.03 to 0.2.

Also, the liquid crystal molecules may be rod-shaped liquid crystal molecules, for example, nematic liquid crystals.

In this case, the inclination angle of the optical axis of the retardation layer may be in a range of 25 degrees to 65 degrees, and the thickness may be in a range of 0.35 μm to 2.2 μm.

Furthermore, in another example, the inclination angle of the optical axis of the retardation layer may be in a range of 35 degrees to 50 degrees, and the thickness may be 0.4 μm to 2.2 μm.

In another example, the liquid crystal molecules may be disk-shaped liquid crystal molecules, for example, discotic liquid crystals.

In this case, the inclination angle of the optical axis of the retardation layer may be in a range of 10 degrees to 35 degrees, and the thickness may be in a range of 1 μm to 3 μm.

The present application is also directed to a display device. An exemplary display device may comprise the circularly polarizing plate.

The specific kind of the display device comprising the circularly polarizing plate is not particularly limited. The device may be, for example, a liquid crystal display such as a reflective type or semi-transmissive reflective type liquid crystal display, or may be an organic light emitting device or the like.

The arrangement type of the circularly polarizing plate in the display device is not particularly limited, and for example, a known type may be adopted. For example, in a reflective type liquid crystal display, the circularly polarizing plate can be used as any one circularly polarizing plate among the circularly polarizing plates of a liquid crystal panel for preventing reflection of external light and ensuring visibility.

In addition, when the circularly polarizing plate is applied to the organic light emitting device, the organic light emitting device comprises a reflective electrode, a transparent electrode, an organic layer interposed between the reflective electrode and the transparent electrode and having a light emitting layer, and the circularly polarizing plate, where the circularly polarizing plate may be present outside the reflective or transparent electrode and a phase difference film may be disposed closer to the reflective or transparent electrode than a polarizer.

The present application can provide a circularly polarizing plate, which can be applied to a display device such as an organic light emitting display device to minimize blocking of light in the visible light region affecting image quality while blocking harmful ultraviolet rays appropriately and also has excellent durability. In addition, the present application can provide a circularly polarizing plate having excellent compensation characteristics at a viewing angle while ensuring process simplification and cost competitiveness.

EXAMPLES

Hereinafter, the present application will be described in detail by way of examples and comparative examples, but the scope of the present application is not limited by the following transmittance-variable devices.

Preparation Example 1. Preparation of Polymerizable Liquid Crystal Composition A A polymerizable liquid crystal composition was prepared using LC1057 liquid crystals of BASF Corporation as a normal dispersion polymerizable liquid crystal compound and a liquid crystal compound of Formula A below as a reverse dispersion liquid crystal compound. The normal dispersion polymerizable liquid crystal compound has R (450)/R (550) in a level of about 1.09 to 1.11 or so and R (650)/R (550) in a level of about 0.93 to 0.95 or so, and the liquid crystal compound of Formula A has R (450)/R (550) in a level of about 0.84 to 0.86 or so and R (650)/R (550) in a level of about 1.01 to 1.03 or so. The R (450), R (550) and R (650) are in-plane phase differences for light having wavelengths of 450 nm, 550 nm and 650 nm, respectively, as measured with respect to a phase difference layer formed by using the normal dispersion polymerizable liquid crystal compound or the polymerizable liquid crystal compound of Formula A alone. The in-plane phase difference can be measured by a known method, and for example, it can be measured by a polarization measurement method using Axoscan (Axometrics), which is a birefringence meter. The method of forming the phase difference layer by using the polymerizable liquid crystal compounds alone is the same as that described in the following examples, except that the polymerizable liquid crystal compounds are applied alone. The normal dispersion polymerizable liquid crystal compound and the reverse dispersion polymerizable liquid crystal compound of Formula A were mixed in a weight ratio of approximately 94:6 to 95:5 (reverse dispersion polymerizable liquid crystal: normal dispersion polymerizable liquid crystal) and about 5 parts by weight of a radical photoinitiator (BASF, Irgacure 907) relative to 100 parts by weight of the total of the polymerizable liquid crystal compounds was combined in a solvent (cyclopentanone) to prepare a polymerizable liquid crystal composition A.

[Formula A]

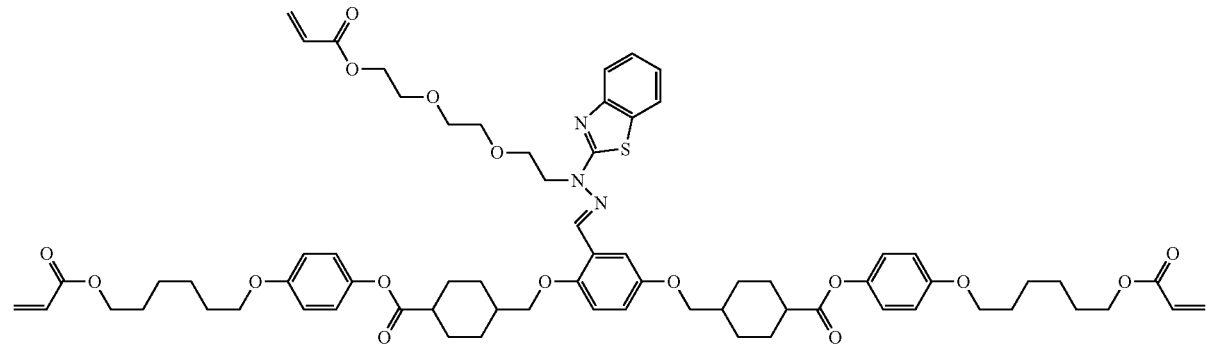

Here, the compound of Formula A was synthesized in the following manner. Under a nitrogen atmosphere, 17.7 g of a compound of Formula A1 below and 100 ml of tetrahydrofuran were placed in a reaction vessel. 103 ml of a 0.9 mol/L borane-tetrahydrofuran complex was dripped while cooling with ice and the mixture was stirred for 1 hour. After dripping 5% hydrochloric acid, the mixture was extracted with ethyl acetate and washed with a saline solution. The extract was dried over sodium sulfate and the solvent was distilled off to obtain 14.9 g of a compound represented by Formula A2 below. Under a nitrogen atmosphere, 14.9 g of the compound represented by Formula A2, 7.2 g of pyridine and 150 ml of dichloromethane were added to the reaction vessel. 8.8 g of methanesulfonyl chloride was dripped while cooling with ice and the mixture was stirred at room temperature for 3 hours. The reactant was poured into water, and washed sequentially with 5% hydrochloric acid and a saline solution. Purification was performed by column chromatography (silica gel, hexane/ethyl acetate) and recrystallization (acetone/hexane) to obtain 16.3 g of a compound represented by Formula A3 (in Formula A3 below, Ms is a methanesulfonyl group). Under a nitrogen atmosphere, 2.5 g of a compound represented by Formula A4, 10.6 g of the compound represented by Formula A3, 7.5 g of potassium carbonate and 70 ml of N,N-dimethylformamide were added to the reaction vessel and the mixture was heated and stirred at 90° C. for 3 days. The reactant was poured into water, extracted with toluene and washed with a saline solution. Purification was performed by column chromatography (silica gel, toluene) and recrystallization (acetone/methanol) to obtain 7.7 g of a compound represented by Formula A5. 7.7 g of the compound represented by Formula A5, 150 ml of dichloromethane and 100 ml of trifluoroacetic acid were added to the reaction vessel and stirred. After the solvent was distilled off, the resulting solid was washed with water and dried to obtain 5.5 g of a compound represented by Formula A6.

Under a nitrogen atmosphere, 5.5 g of the compound represented by Formula A6, 6.9 g of a compound represented by Formula A7, 0.8 g of N,N-dimethylaminopyridine and 200 ml of dichloromethane were added to the reaction vessel. 4.1 g of diisopropylcarbodiimide was dripped while cooling with ice and the mixture was stirred at room temperature for 10 hours. After the precipitate was removed by filtration, the filtrate was washed successively with 1% hydrochloric acid, water and a saline solution. After performing recrystallization (dichloromethane/methanol), purification was performed by column chromatography (silica gel, dichloromethane) and recrystallization (dichloromethane/methanol) to obtain 8.4 g of a compound represented by Formula A8.

1.4 g of the compound represented by Formula A8, 0.35 g of 2-hydrazinobenzothiazole and 5 ml of tetrahydrofuran were added to a 30 ml three-necked flask, and the mixture was stirred at 25° C. for 9 hours. Then, 50 ml of water was added, and the mixture was extracted twice with 30 ml of ethyl acetate. The resulting organic phase was dried with sodium sulfate. After sodium sulfate was filtered off, the organic phase was concentrated under reduced pressure. The resulting residue was purified by silica gel column chromatography (hexane/ethyl acetate=2/1). The resulting crude product was subjected to reprecipitation using acetone/methanol. These crystals were filtered and dried to obtain 0.98 g of a compound represented by Formula A9. Subsequently, the hydrogen atom attached to the nitrogen atom of the compound represented by Formula A9 was substituted with a 2-[2-(2-acryloyloxyethoxy)ethoxy]ethyl group to obtain the compound represented by Formula A. NMR confirmatory results of the resulting compound of Formula A were described below.

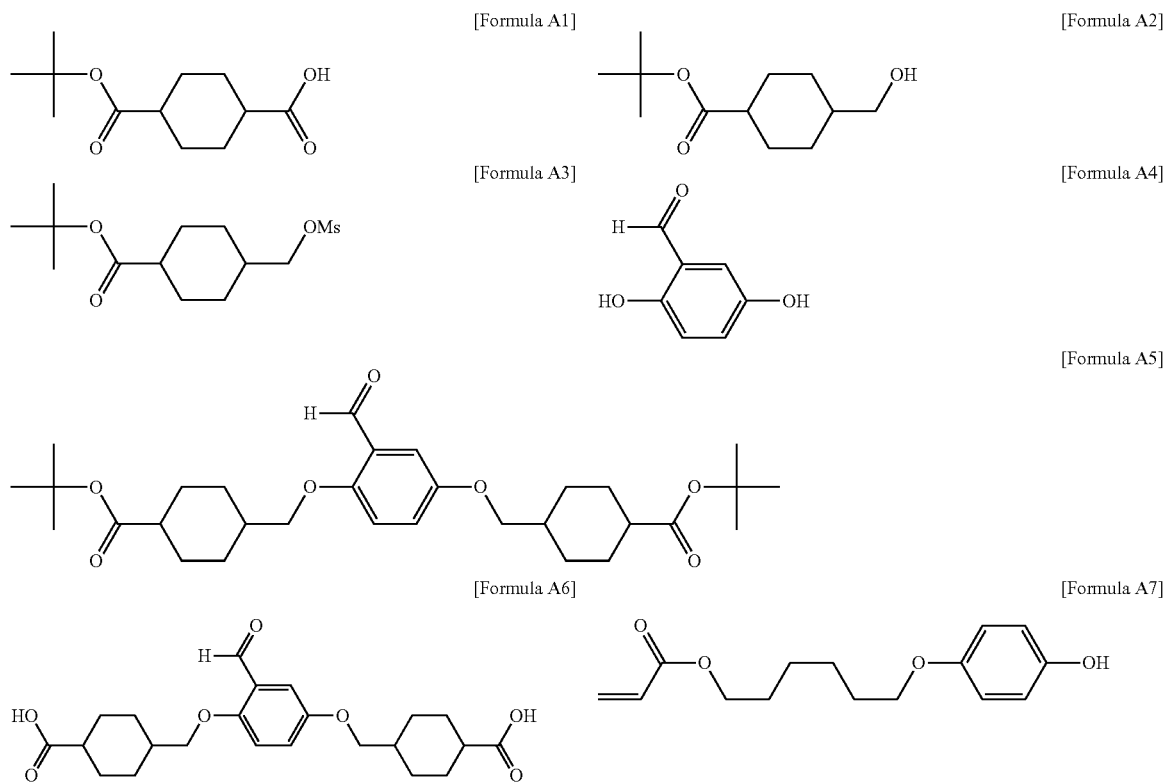

-continued

[Formula A8]

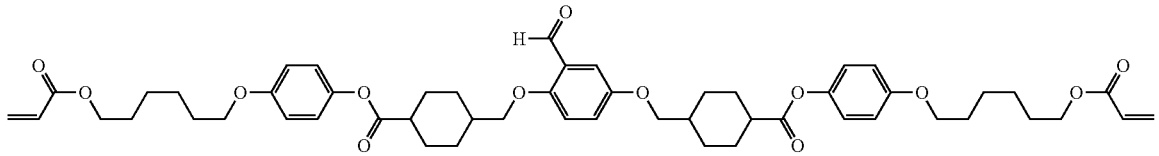

[Formula A9]

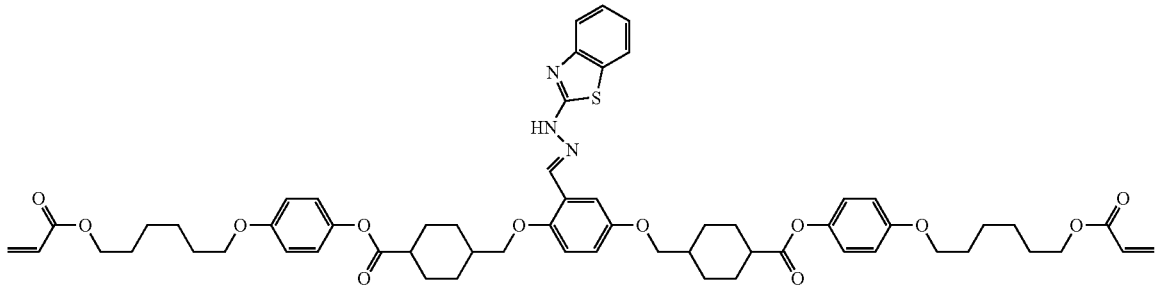

<NMR Results>
$^1$H NMR (CDCl$_3$) δ 1.19-1.29 (m, 4H), 1.41-1.82 (m, 22H), 1.91 (m, 2H), 2.08 (m, 4H), 2.24 (m, 4H), 2.53 (m, 2H), 3.62 (m, 3H), 3.67 (m, 2H), 3.84-3.90 (m, 5H), 3.94 (t, 4H), 4.15-4.19 (m, 6H), 4.53 (t, 2H), 5.76 (dd, 1H), 5.82 (dd, 2H), 6.08 (dd, 1H), 6.12 (dd, 2H), 6.37 (dd, 1H), 6.40 (dd, 2H), 6.84-6.90 (m, 6H), 6.95-6.98 (m, 4H), 7.14 (t, 1H), 7.32 (t, 1H), 7.53 (d, 1H), 7.65 (d, 1H), 7.69 (d, 1H), 8.34 (s, 1H) ppm.

Preparation Example 2. Preparation of Polymerizable Liquid Crystal Composition B A polymerizable liquid crystal composition B was prepared in the same manner as in Preparation Example 1, except that a liquid crystal compound of Formula B below was applied as the reverse dispersion polymerizable liquid crystal compound. The liquid crystal compound of Formula B has R (450)/R (550) in a level of about 0.81 to 0.83 or so and R (650)/R (550) in a level of about 1.01 to 1.03 or so. The R (450), R (550) and R (650) are in-plane phase differences for light having wavelengths of 450 nm, 550 nm and 650 nm, as measured with respect to a phase difference layer formed by using the polymerizable liquid crystal compound of Formula B alone.

Here, the compound of the Formula B was obtained by obtaining a compound represented by Formula A9 below in the same manner as in Preparation Example 1 and then substituting the hydrogen atom attached to the nitrogen atom of the compound represented by Formula A9 with a 2-[2-(methoxyethoxy)]ethyl group. NMR confirmatory results of the resulting compound of Formula B were described below.
<NMR Results>
$^1$H NMR (CDCl$_3$) δ 1.22-1.28 (m, 4H), 1.44-1.47 (m, 8H), 1.60-1.82 (m, 12H), 1.90 (m, 2H), 2.07 (t, 4H), 2.24 (d, 4H), 2.53 (m, 2H), 3.30 (s, 3H), 3.50 (t, 2H), 3.66 (t, 2H), 3.85-3.89 (m, 6H), 3.93 (t, 4H), 4.17 (t, 4H), 4.53 (t, 2H), 5.82 (d, 2H), 6.13 (q, 2H), 6.40 (d, 2H), 6.83-6.90 (m, 6H), 6.95-6.98 (m, 4H), 7.14 (t, 1H), 7.32 (t, 1H), 7.52 (t, 1H), 7.67 (t, 2H), 8.33 (s, 1H) ppm.

Preparation Example 3. Preparation of Polymerizable Liquid Crystal Composition C A polymerizable liquid crystal composition was prepared by applying the reverse dispersion polymerizable liquid crystal compound of Formula A in Preparation Example 1 above, the same photoinitiator as that used in Preparation Example 1 and an ultraviolet absorber (Orient Chemical Industries, BONASORB UA-3912) having a maximum absorption wavelength range of about 380 to 390 nm as an

[Formula B]

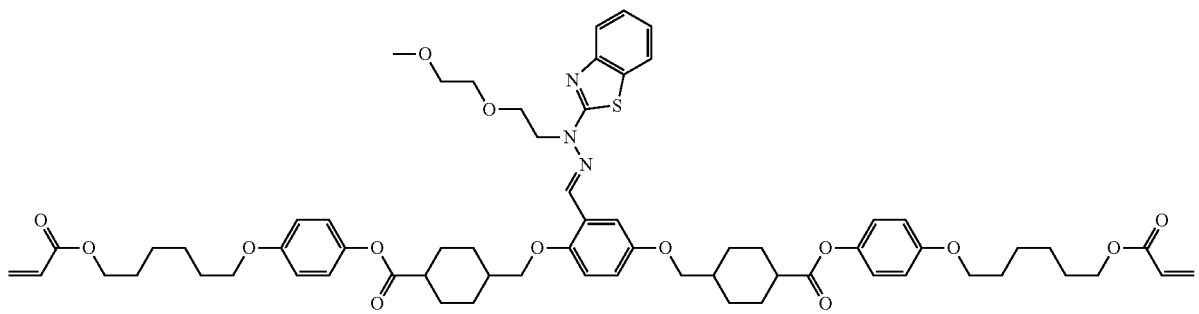

ultraviolet absorber. The reverse dispersion polymerizable liquid crystal compound of Formula A, the photoinitiator and the ultraviolet absorber were combined in a solvent (cyclopentanone) in a weight ratio of 20:1:1 (reverse dispersion polymerizable liquid crystal compound: photoinitiator: ultraviolet absorber) to prepare a polymerizable liquid crystal composition C.

Preparation Example 4. Preparation of Polymerizable Liquid Crystal Composition D A polymerizable liquid crystal composition D was prepared in the same manner as in the case of Preparation Example 3, except that the reverse dispersion polymerizable liquid crystal compound of Formula A, the photoinitiator and the ultraviolet absorber were combined in a weight ratio of 20:1:0.6 (reverse dispersion polymerizable liquid crystal compound: photoinitiator: ultraviolet absorber).

Example 1

Production of Base Film 37 parts by weight of SAN (styrene-acrylonitrile copolymer) and 30 parts by weight of an acrylic resin (Lactone-MMA copolymer) were mixed with 0.05 parts by weight of a 5% polyvinyl alcohol aqueous solution, 200 parts by weight of water, 0.08 parts by weight of t-hexylperoxy-2-ethylhexanoate as an initiator, 0.2 parts by weight of t-dodecylmercaptan and 0.1 parts by weight of NaCl to prepare a mixture. The prepared mixture was subjected to primary suspension polymerization at an initial reaction temperature of 80° C. for 2 hours and then subjected to secondary polymerization for 1 hour by raising the temperature to 95° C., washed and dried to produce Lactone-MMA-SAN beads. The resulting beads were re-extruded twice through a co-rotating twin-screw extruder at 270° C. to prepare a resin in a pellet state, where the vacuum degree (Torr) was 20. After the prepared pellets were dried, an extruded film having a thickness of 180 μm was produced using an extruder including a T-die. A film having a thickness of 50 μm was produced through biaxial stretching of the prepared film by 2 times in the MD direction and 3 times in the TD direction. The Rin value of the prepared film for a wavelength of 550 nm is 1.5 nm and the Rth value for a wavelength of 550 nm is 58.4 nm.

Production of Phase Difference Layer

A photo-alignment film was formed on the base film. A known cinnamate series composition for forming a photo-alignment film was applied on the base film to a thickness of about 100 nm and irradiated with linearly polarized ultraviolet rays at about 300 mW/cm² to form it. Subsequently, the polymerizable liquid crystal composition A was coated on the photo-alignment film to be a dry thickness of about 1 μm, oriented along the lower alignment film, and then irradiated with ultraviolet rays at about 300 mW/cm² for about 10 seconds to form a phase difference layer. The in-plane phase difference of the phase difference layer for light having a wavelength of 550 nm was about 146.0 nm. The formed phase difference layer had R (450)/R (550) in a level of about 0.85 to 0.87 or so and R (650)/R (550) in a level of about 1.01 to 1.05 or so.

Production of Circularly Polarizing Plate

The produced phase difference layer was attached to one side of a known iodine PVA (poly(vinyl alcohol)) polarizer (LG Chemical Co., Ltd.) as a polarizer to produce a circularly polarizing plate. For attachment, a general ultraviolet curable adhesive used for lamination of an optical film was applied.

Example 2

Production of Phase Difference Layer

A phase difference layer was formed in the same manner as in Example 1, except that the polymerizable liquid crystal composition B was applied instead of the polymerizable liquid crystal composition A. The in-plane phase difference of the phase difference layer for light having a wavelength of 550 nm was about 144.5 nm. The formed phase difference layer had R (450)/R (550) in a level of about 0.82 to 0.85 or so and R (650)/R (550) in a level of about 1.01 to 1.05 or so.

Production of Circularly Polarizing Plate

A circularly polarizing plate was produced in the same manner as in Example 1, using the produced phase difference layer.

Comparative Example 1

Production of Phase Difference Layer

A phase difference layer was formed in the same manner as in Example 1, except that the polymerizable liquid crystal composition C was applied instead of the polymerizable liquid crystal composition A. The in-plane phase difference of the phase difference layer for light having a wavelength of 550 nm was about 131.7 nm. The formed phase difference layer had R (450)/R (550) in a level of about 0.84 to 0.86 or so and R (650)/R (550) in a level of about 1.01 to 1.03 or so.

Production of Circularly Polarizing Plate

A circularly polarizing plate was produced in the same manner as in Example 1, using the produced phase difference layer.

Comparative Example 2

Production of Phase Difference Layer

A phase difference layer was formed in the same manner as in Example 1, except that the polymerizable liquid crystal composition D was applied instead of the polymerizable liquid crystal composition A. The in-plane phase difference of the phase difference layer for light having a wavelength of 550 nm was about 140.7 nm. The formed phase difference layer had R (450)/R (550) in a level of about 0.81 to 0.83 or so and R (650)/R (550) in a level of about 1.01 to 1.03 or so.

Production of Circularly Polarizing Plate

A circularly polarizing plate was produced in the same manner as in Example 1, using the produced phase difference layer.

Evaluation 1. Comparison of Ultraviolet Absorption Characteristics.

The ultraviolet absorption characteristics of each of the phase difference layers produced in Examples and Comparative Examples were compared. The ultraviolet absorption characteristics for each wavelength were evaluated for a specimen that an alignment film and a liquid crystal layer (phase difference layer) were sequentially formed on an NRT base material which does not exhibit any absorption peak in a wavelength region of 300 nm or more by a method shown in each of Examples and Comparative Examples by using N&K UV Spectrometer (HP). FIGS. 6 and 7 are measurement results for Examples 1 and 2, respectively and FIGS. 8 and 9 are measurement results for Comparative Examples 1 and 2, respectively. The specific transmittance for each wavelength was summarized in Table 1 below.

TABLE 1

| | Transmittance (unit: %) | | | |
|---|---|---|---|---|
| | 385 nm | 390 nm | 395 nm | 400 nm |
| Example 1 | 1.7 | 3.7 | 10.4 | 27.0 |
| Example 2 | 1.7 | 3.8 | 10.5 | 27.2 |
| Comparative Example 1 | 0.5 | 0.9 | 2.6 | 7.0 |
| Comparative Example 2 | 0.7 | 1.6 | 4.3 | 11.6 |

From Table 1, it can be confirmed that the present application can secure superior ultraviolet blocking properties without applying an ultraviolet absorber.

Evaluation 2. Durability Evaluation.

Durability was evaluated for each of the phase difference layers produced in Examples and Comparative Examples. The durability was evaluated by maintaining each of the phase difference layers produced in Examples and Comparative Examples at a condition of about 85° C. (endurance condition) for 250 hours, and then comparing the in-plane phase difference (based on a wavelength of 550 nm) before maintaining the condition and the in-plane phase difference (based on a wavelength of 550 nm) after maintaining the condition. FIGS. 10 and 11 are measurement results for Examples 1 and 2, respectively and FIGS. 12 and 13 are measurement results for Comparative Examples 1 and 2, respectively.

TABLE 2

| | In-plane phase difference (based on a wavelength of 550 nm) | | |
|---|---|---|---|
| | Before maintaining endurance condition | After maintaining endurance condition | Change amount |
| Example 1 | 146.0 nm | 123.8 nm | −15.2% |
| Example 2 | 144.5 nm | 123.8 nm | −14.8% |
| Comparative Example 1 | 131.7 nm | 101.7 nm | −22.8% |
| Comparative Example 2 | 140.7 nm | 113.6 nm | −19.3% |

From the results of Table 2, in the case of the phase difference layer according to the present application, it can be confirmed that it has excellent ultraviolet absorbing ability without using an ultraviolet absorber or a light stabilizer and also as a result, shows excellent results in terms of durability.

EXPLANATION OF REFERENCE NUMERALS

101: polarizer 102: phase difference layer 103: base film
100: phase difference layer, retardation layer, phase difference film, optical film, base film
301: outer layer 401: lower layer 501: middle layer

The invention claimed is:

1. A circularly polarizing plate comprising a base film, a phase difference layer on the base film, and a polarizer on the phase difference layer,
    wherein the base film comprises an acrylic resin and a styrene-based resin,
    the base film has a planar phase difference value of 5 nm or less in Equation 1 below and a thickness direction phase difference value of more than 0 nm in Equation 2 below, and
    the phase difference layer has ultraviolet absorptivity such that transmittance for light having a wavelength of 385 nm is 3% or less:

$$Rin = d \times (nx - ny), \quad \text{[Equation 1]}$$

$$Rth = d \times (nz - ny), \quad \text{[Equation 2]}$$

wherein, Rin is the planar phase difference, Rth is the thickness direction phase difference, nx, ny and nz are the refractive indexes of the base film in the slow axis direction, in the fast axis direction and in the thickness direction, respectively, and d is the thickness of the base film.

2. The circularly polarizing plate according to claim 1, wherein the acrylic resin has one or more ring structures selected from the group consisting of a structure formed by copolymerizing N-substituted maleimide in molecular chains, a lactone ring structure and a glutarimide structure.

3. The circularly polarizing plate according to claim 1, wherein the styrene-based resin comprises a styrene-acrylonitrile copolymer, a styrene-methacrylic acid copolymer or a styrene-maleic anhydride copolymer.

4. The circularly polarizing plate according to claim 1, wherein the thickness direction phase difference value of the base film is 50 nm to 120 nm.

5. The circularly polarizing plate according to claim 1, wherein the base film has a thickness of 1 μm to 300 μm.

6. The circularly polarizing plate according to claim 1, wherein there is no pressure-sensitive adhesive layer or adhesive layer between the phase difference layer and the base film.

7. The circularly polarizing plate according to claim 1, further comprising a liquid crystal alignment film or a primer layer between the phase difference layer and the base film.

8. The circularly polarizing plate according to claim 1, wherein the phase difference layer has an absolute value of a phase difference change ratio according to Equation A below of 17% or less:

$$\text{Phase difference change ratio} = 100 \times (Ra - Ri)/Ri \quad \text{[Equation A]}$$

wherein, Ri is the initial in-plane phase difference of the phase difference layer for a wavelength of 550 nm, and Ra is the in-plane phase difference of the phase difference layer for a wavelength of 550 nm after an endurance condition, where the endurance condition is a condition that the phase difference layer is allowed to stand at a temperature of 85° C. for 50 hours or more.

9. The circularly polarizing plate according to claim 1, wherein the phase difference layer does not contain an ultraviolet absorber having a maximum absorption wavelength in a range of 385 nm to 400 nm.

10. The circularly polarizing plate according to claim 1, wherein the polarizer is a linear polarizer having single transmittance at a wavelength of 390 nm of 20% to 60%.

11. The circularly polarizing plate according to claim 1, wherein the phase difference layer has transmittance of 15% or less for light having a wavelength of 390 nm.

12. The circularly polarizing plate according to claim 1, wherein the phase difference layer has transmittance of 40% or less for light having a wavelength of 400 nm.

13. The circularly polarizing plate according to claim 1, wherein the phase difference layer has a ratio (R (450)/R (550)) of a planar phase difference (R (450)) for light having a wavelength of 450 nm to a planar phase difference (R (550)) for light having a wavelength of 550 nm in a range of 0.6 to 0.99.

14. The circularly polarizing plate according to claim 1, wherein the phase difference layer has a ratio (R (650)/R (550)) of a planar phase difference (R (650)) for light having a wavelength of 650 nm to a planar phase difference (R (550)) for light having a wavelength of 550 nm in a range of 1.00 to 1.19.

15. The circularly polarizing plate according to claim 1, wherein the phase difference layer comprises polymerized units of a normal dispersion polymerizable liquid crystal compound and polymerized units of a reverse dispersion polymerizable liquid crystal compound, wherein the normal dispersion polymerizable liquid crystal compound and the reverse dispersion polymerizable liquid crystal compound have a ratio (R (450)/R (550)) of a planar phase difference (R (450)) for light having a wavelength of 450 nm to a planar phase difference (R (550)) for light having a wavelength of 550 nm of 0.6 to 0.99 and 1.04-1.25, respectively.

16. The circularly polarizing plate according to claim 15, wherein the normal dispersion polymerizable liquid crystal compound is represented by Formula 6 below:

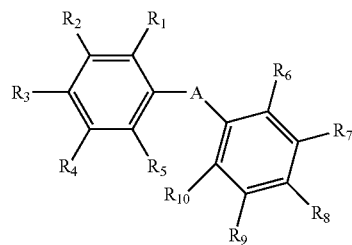

[Formula 6]

wherein, A is a single bond, —C(=O)O— or —OC(=O)— and $R_1$ to $R_{10}$ are each independently hydrogen, halogen, an alkyl group, an alkoxy group, an alkoxycarbonyl group, a cyano group, a nitro group or a substituent of Formula 7 below, or two neighboring substituents of $R_1$ to $R_5$ or two neighboring substituents of $R_6$ to $R_{10}$ are bonded to each other to constitute a benzene ring substituted with -L-A-P, where L is —C(=O)O—, —OC(=O)— or —OC(=O)O—, A is an alkylene group and P is an acryloyl group, a methacryloyl group, an acryloyloxy group or a methacryloyloxy group:

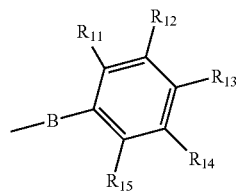

[Formula 7]

wherein, B is a single bond, —C(=O)O— or —OC(=O)— and $R_{11}$ to $R_{15}$ are each independently hydrogen, halogen, an alkyl group, an alkoxy group, an alkoxycarbonyl group, a cyano group, a nitro group or -L-A-P, or two neighboring substituents of $R_{11}$ to $R_{15}$ are bonded to each other to constitute a benzene ring substituted with -L-A-P, where L is —C(=O)O—, —OC(=O)— or —OC(=O)O—, A is an alkylene group and P is an acryloyl group, a methacryloyl group, an acryloyloxy group or a methacryloyloxy group.

17. The circularly polarizing plate according to claim 15, wherein the reverse dispersion polymerizable liquid crystal compound is represented by Formula 1 below:

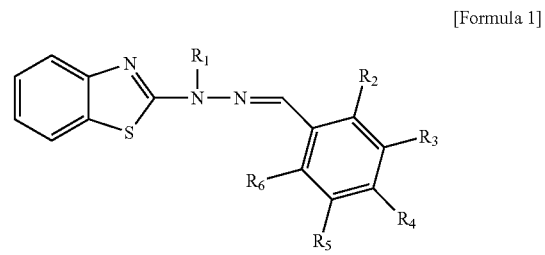

[Formula 1]

wherein, $R_1$ is a substituent of Formula 2 or 3 below, and $R_2$ to $R_6$ are each independently hydrogen, an alkyl group, an alkoxy group, a cyano group, a substituent of Formula 4 below or a substituent of Formula 5 below: Here, at least two or more or two of $R_2$ to $R_6$ are also substituents of Formula 4 below or substituents of Formula 5 below:

-$A_1$-$L_1$-Cyc-$A_2$-$L_2$-P    [Formula 2]

wherein, $A_1$ and $A_2$ are each independently an oxygen atom or a single bond, $L_1$ and $L_2$ are each independently —C(=O)—O—, —O—C(=O)— or an alkylene group, Cyc is an arylene group or a cycloalkylene group, and P is an acryloyl group, a methacryloyl group, an acryloyloxy group or a methacryloyloxy group:

—$L_3$—(O—$L_4$)$_n$—P    [Formula 3]

wherein, $L_3$ and $L_4$ are each an alkylene group, n is a number in a range of 1 to 4, and P is an acryloyl group, a methacryloyl group, an acryloyloxy group or a methacryloyloxy group or a hydrogen atom:

-$A_3$-$L_5$-Cyc-$A_4$-$L_6$-P    [Formula 4]

wherein, $A_3$ and $A_4$ are an oxygen atom, an alkylene group or a single bond, $L_5$ and $L_6$ are each independently —C(=O)—O—, —O—C(=O)— or an alkylene group, Cyc is an arylene group, and P is an acryloyl group, a methacryloyl group, an acryloyloxy group or a methacryloyloxy group:

-$A_5$-$L_7$-$Cy_1$-$A_6$-$L_8$-$Cy_2$-$A_7$-$L_9$-P    [Formula 5]

wherein, $A_5$, $A_6$ and $A_7$ are each independently an oxygen atom or a single bond, $L_7$, $L_8$ and $L_9$ are each independently —C(=O)—O—, —O—C(=O)— or an alkylene group, Cy1 is a cycloalkylene group, Cy2 is an arylene group, and P is an acryloyl group, a methacryloyl group, an acryloyloxy group or a methacryloyloxy group.

18. The circularly polarizing plate according to claim 15, wherein the phase difference layer comprises 40 wt % or more of polymerized units of the reverse dispersion polymerizable liquid crystal compound in polymerized units of the entire polymerizable liquid crystal compound.

19. The circularly polarizing plate according to claim 15, wherein the phase difference layer comprises 30 wt % or more of polymerized units of the polymerizable liquid crystal compound having tri-functionality or more in polymerized units of the entire polymerizable liquid crystal compound.

20. An organic light emitting display device comprising a reflective electrode, a transparent electrode, an organic layer interposed between the reflective electrode and the transparent electrode and having a light emitting layer, and the circularly polarizing plate of claim 1, wherein the circularly polarizing plate is present outside the reflective or transparent electrode and the phase difference layer is disposed closer to the reflective or transparent electrode than the polarizer.

* * * * *